United States Patent
Sonderman et al.

(10) Patent No.: US 7,324,865 B1
(45) Date of Patent: Jan. 29, 2008

(54) RUN-TO-RUN CONTROL METHOD FOR AUTOMATED CONTROL OF METAL DEPOSITION PROCESSES

(75) Inventors: Thomas Sonderman, Austin, TX (US); Scott Bushman, Richardson, TX (US); Craig William Christian, Buda, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 80 days.

(21) Appl. No.: 09/851,905

(22) Filed: May 9, 2001

(51) Int. Cl.
*G06F 19/00* (2006.01)
*H01L 21/00* (2006.01)

(52) U.S. Cl. .......................................... 700/121; 438/5
(58) Field of Classification Search ................. 700/121, 700/123, 28–33, 46
See application file for complete search history.

(56) References Cited

U.S. PATENT DOCUMENTS

| | | | | |
|---|---|---|---|---|
| 4,166,783 A | * | 9/1979 | Turner | ................... 204/192.13 |
| 5,665,214 A | * | 9/1997 | Iturralde | ................. 204/298.03 |
| 6,178,390 B1 | * | 1/2001 | Jun | ............................ 702/170 |
| 6,217,720 B1 | * | 4/2001 | Sullivan et al. | ......... 204/192.13 |
| 6,324,439 B1 | * | 11/2001 | Cheung et al. | ............. 700/121 |

OTHER PUBLICATIONS

Smith, T.H., Boning, D.S., Stefani, J. and Butler, S.W. "Run by Run Advanced Process Control of Metal Sputter Deposition". IEEE Transactions on Semiconductor Manufacturing 11.2 (1998): 276-284.*

* cited by examiner

*Primary Examiner*—Ryan A. Jarrett
(74) *Attorney, Agent, or Firm*—Williams, Morgan & Amerson, P.C.

(57) ABSTRACT

A method is provided, the method comprising monitoring consumption of a sputter target to determine a deposition rate of a metal layer during metal deposition processing using the sputter target, and modeling a dependence of the deposition rate on at least one of deposition plasma power and deposition time. The method also comprises applying the deposition rate model to modify the metal deposition processing to form the metal layer to have a desired thickness.

49 Claims, 16 Drawing Sheets

RUN-TO-RUN CONTROL METHOD FOR AUTOMATED CONTROL OF METAL DEPOSITION PROCESSES

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are process parameters related to metal deposition processing (MDP). Examples of such process parameters include the deposition thickness and deposition rate. The metal deposition processing (MDP) performance is typically affected by the consumption of the sputter target during consecutive processing runs. In particular, the deposition rate is affected by the sputter target life. Typically, the deposition rate decreases the longer the sputter target is used. Conventionally, this deposition rate decrease has been corrected manually by the process engineer, using a "seat of the pants" approach that may lead to misprocessing, e.g., the process may be continued for an incrementally longer duration. This may cause differences in wafer processing between successive runs or batches or lots of wafers, leading to decreased satisfactory wafer throughput, decreased reliability, decreased precision and decreased accuracy in the semiconductor manufacturing process.

However, traditional statistical process control (SPC) techniques are often inadequate to control precisely process parameters related to metal deposition processing (MDP) in semiconductor and microelectronic device manufacturing so as to optimize device performance and yield. Typically, statistical process control (SPC) techniques set a target value, and a spread about the target value, for the process parameters related to metal deposition processing (MDP). The statistical process control (SPC) techniques then attempt to minimize the deviation from the target value without automatically adjusting and adapting the respective target values to optimize the semiconductor device performance, and/or to optimize the semiconductor device yield and throughput. Furthermore, blindly minimizing non-adaptive processing spreads about target values may not increase processing yield and throughput.

Traditional control techniques are frequently ineffective in reducing off-target processing and in improving sort yields. For example, the wafer electrical test (WET) measurements are typically not performed on processed wafers until quite a long time after the wafers have been processed, sometimes not until weeks later. When one or more of the processing steps are producing resulting wafers that wafer electrical test (WET) measurements indicate are unacceptable, causing the resulting wafers to be scrapped, this misprocessing goes undetected and uncorrected for quite a while, often for weeks, leading to many scrapped wafers, much wasted material and decreased overall throughput.

The present invention is directed to overcoming, or at least reducing the effects of, one or more of the problems set forth above.

SUMMARY OF THE INVENTION

In one aspect of the present invention, a method is provided, the method comprising monitoring consumption of a sputter target to determine a deposition rate of a metal layer during metal deposition processing using the sputter target, and modeling a dependence of the deposition rate on at least one of deposition plasma power and deposition time. The method also comprises applying the deposition rate model to modify the metal deposition processing to form the metal layer to have a desired thickness.

In another aspect of the present invention, a computer-readable, program storage device is provided, encoded with instructions that, when executed by a computer, perform a method, the method comprising monitoring consumption of a sputter target to determine a deposition rate of a metal layer during metal deposition processing using the sputter target, and modeling a dependence of the deposition rate on at least one of deposition plasma power and deposition time. The method also comprises applying the deposition rate model to modify the metal deposition processing to form the metal layer to have a desired thickness.

In yet another aspect of the present invention, a computer programmed to perform a method is provided, the method comprising monitoring consumption of a sputter target to determine a deposition rate of a metal layer during metal deposition processing using the sputter target, and modeling a dependence of the deposition rate on at least one of deposition plasma power and deposition time. The method also comprises applying the deposition rate model to modify the metal deposition processing to form the metal layer to have a desired thickness.

In another aspect of the present invention, a system is provided, the system comprising a tool monitoring consumption of a sputter target to determine a deposition rate of a metal layer during metal deposition processing using the sputter target, and a computer modeling a dependence of the deposition rate on at least one of deposition plasma power and deposition time. The system also comprises a controller applying the deposition rate model to modify the metal deposition processing to form the metal layer to have a desired thickness.

In yet another aspect of the present invention, a device is provided, the device comprising means for monitoring consumption of a sputter target to determine a deposition rate of a metal layer during metal deposition processing using the sputter target, and means for modeling a dependence of the deposition rate on at least one of deposition plasma power and deposition time. The device also comprises means for applying the deposition rate model to modify the metal deposition processing to form the metal layer to have a desired thickness.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1, and 3-10 schematically illustrate a flow chart for various illustrative embodiments of a method according to the present invention;

FIG. 2 schematically illustrates a metal deposition rate plotted against a sputter target life;

FIG. 11 schematically illustrates a method for fabricating a semiconductor device practiced in accordance with the present invention;

FIG. 12 schematically illustrates workpieces being processed using a metal deposition processing (MDP) tool, using a plurality of control input signals, in accordance with the present invention;

FIGS. 13-14 schematically illustrate one particular embodiment of the process and tool in FIG. 12;

FIG. 15 schematically illustrates one particular embodiment of the method of FIG. 11 that may be practiced with the process and tool of FIGS. 13-14; and FIGS. 16-19 schematically illustrate geometrically polynomial least-squares fitting, in accordance with the present invention.

Figure 1:
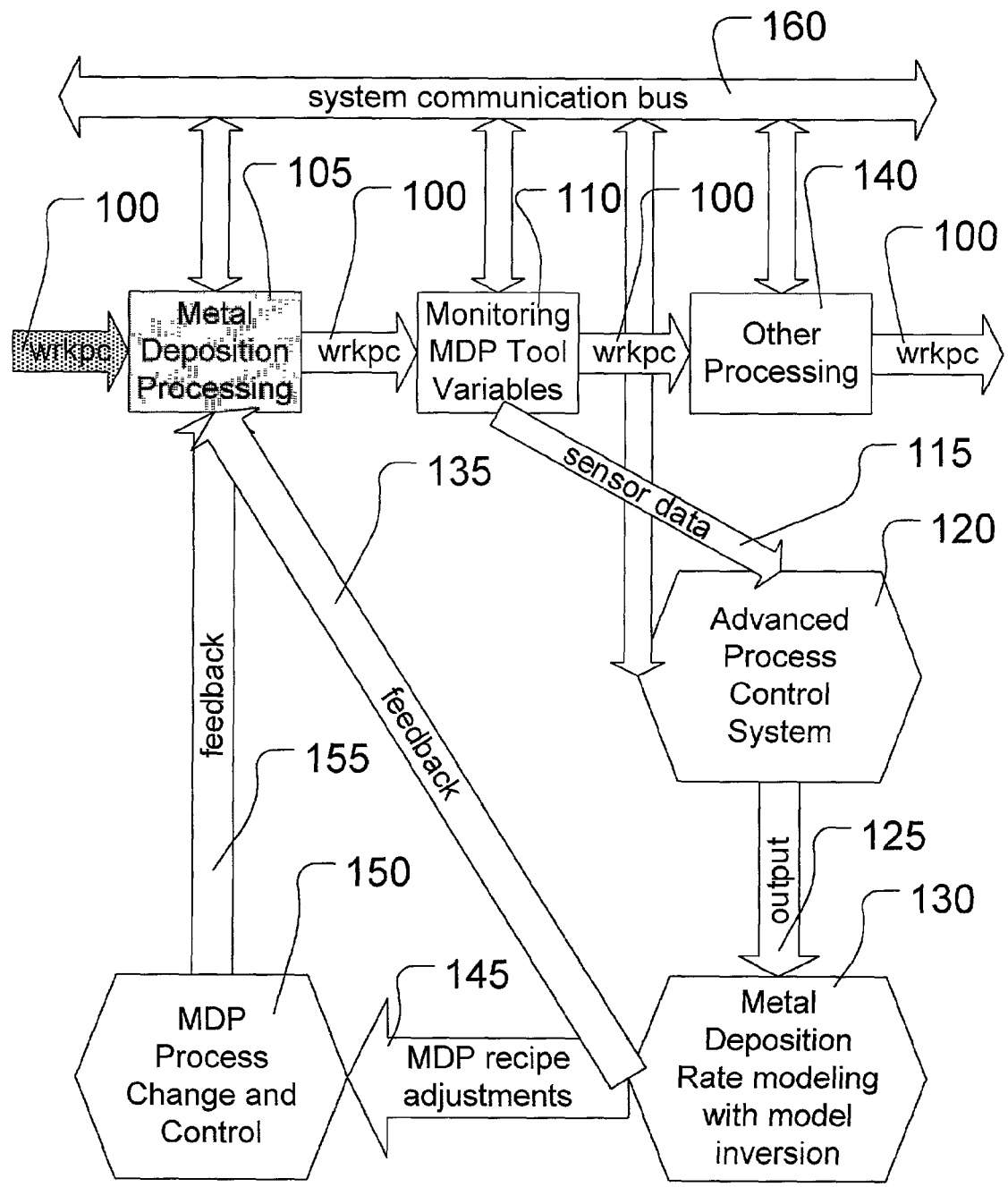
FIGS. 1-19 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method according to the present invention are shown in FIGS. 1-19. As shown in FIG. 1, a workpiece 100, such as a semiconducting substrate or wafer, having zero, one or more process layers and/or semiconductor devices such as a metal-oxide-semiconductor (MOS) transistor disposed thereon, for example, is delivered to a metal deposition processing (MDP) step 105. In the metal deposition processing (MDP) step 105, metal deposition processing may be performed on the workpiece 100.

Figure 2:
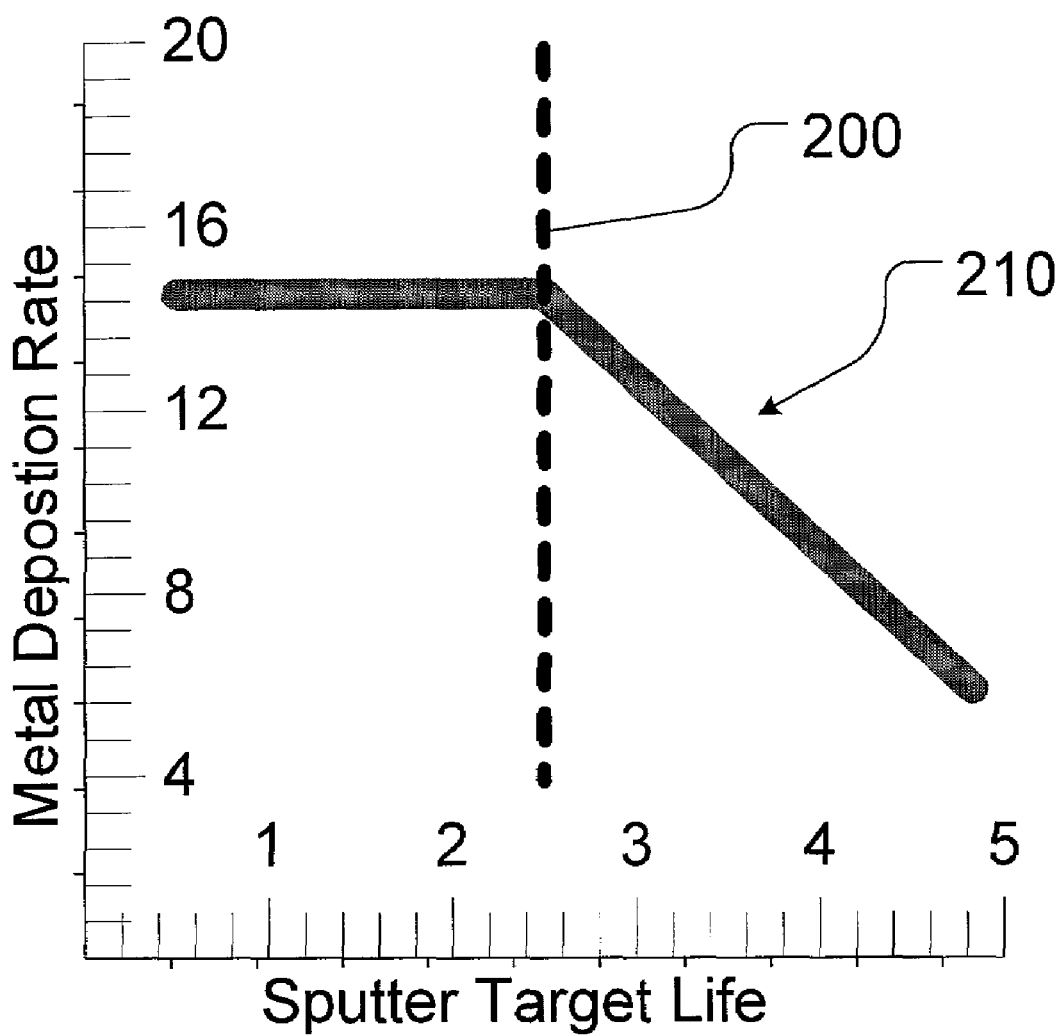

As shown in FIG. 2, a dependence of a metal deposition rate on a sputter target life is illustrated. Sputter target consumption, measured by sputter target life (in arbitrary units), is plotted along the horizontal axis against deposition rates (in arbitrary units) plotted along the vertical axis. As described above, to the right of dotted line 200, generally the metal deposition rate 210 decreases as the sputter target life increases. The dependence of the metal deposition rate on the sputter target life may be determined by modeling, as described more fully below.

Figure 3:
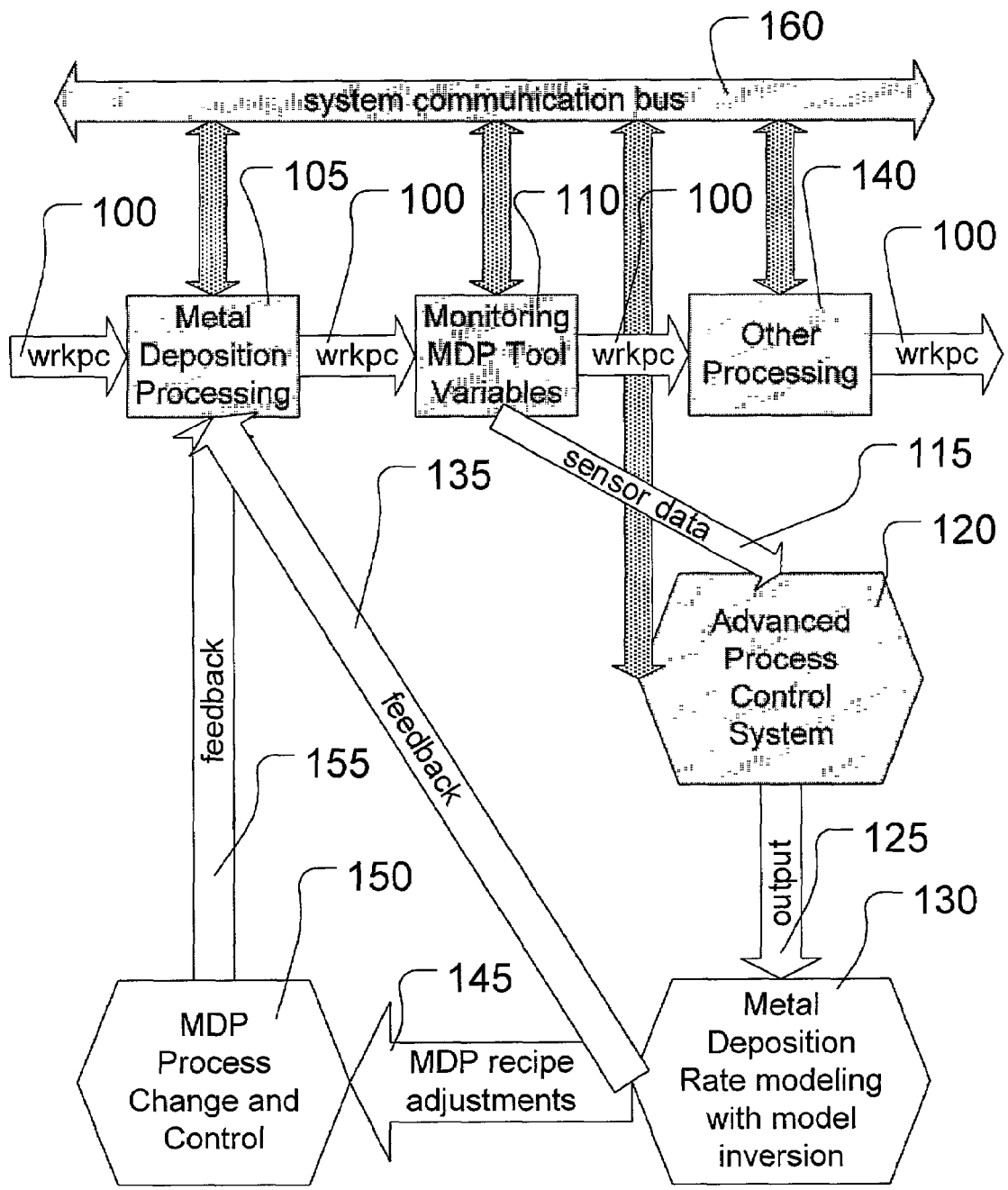

As shown in FIG. 3, the metal deposition processing (MDP) step 105 may communicate with a monitoring step 110 and other processing steps 140 via bidirectional connections through a system communications bus 160. As shown in FIG. 3, the system communications bus 160 also provides communications between the metal deposition processing (MDP) step 105, the monitoring step 110 and other processing steps 140, and an Advanced Process Control (APC) system 120, more fully described below.

Figure 4:
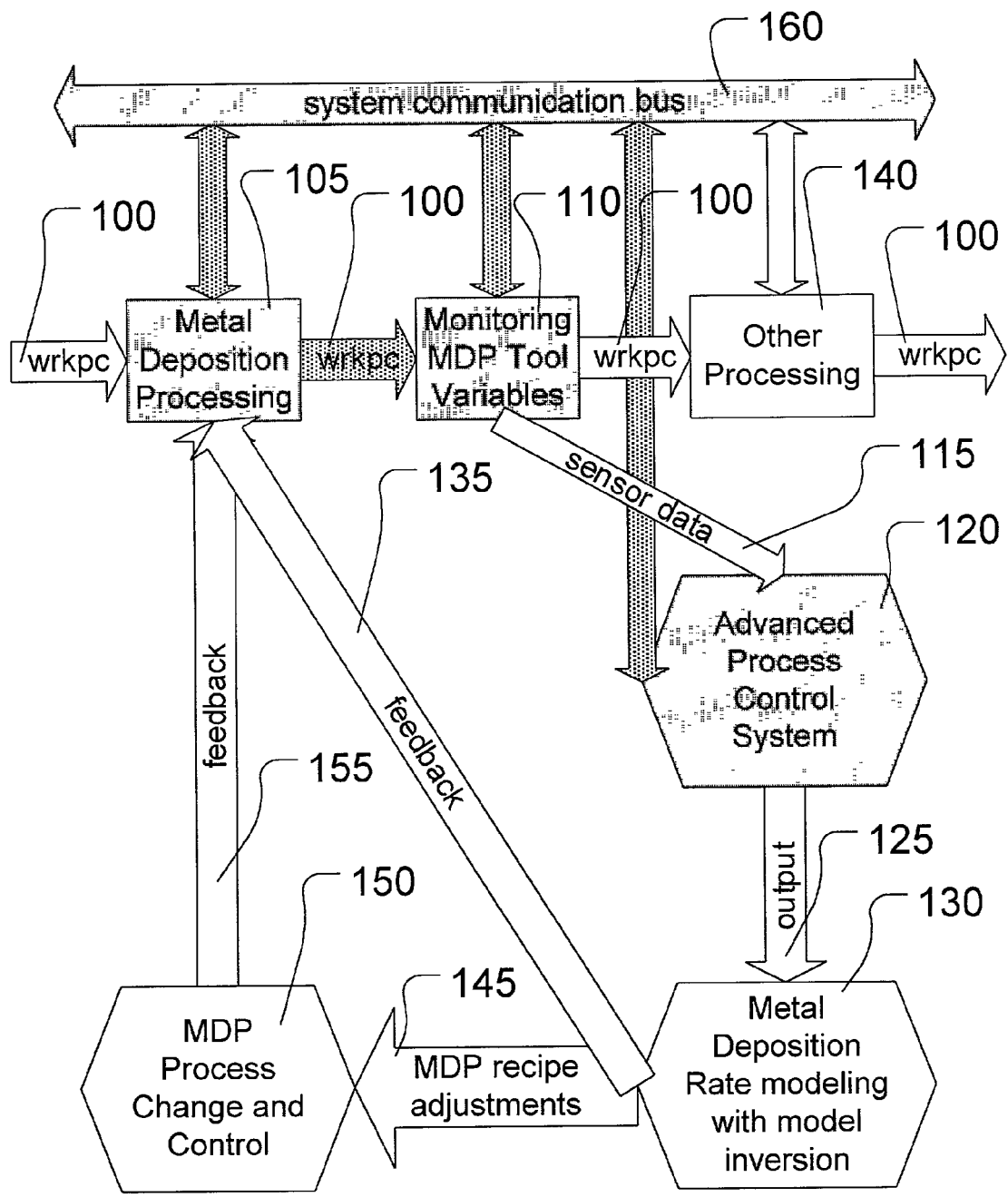

As shown in FIG. 4, the workpiece 100 is sent from the metal deposition processing (MDP) step 105 and delivered to the monitoring step 110. In the monitoring step 110, one or more metal deposition processing (MDP) tool variables and/or one or more metal deposition processing (MDP) parameters during one or more metal deposition processing (MDP) runs may be monitored and/or measured. Examples of such tool variables and/or metal deposition processing (MDP) parameters may comprise the degree of sputter target consumption (as measured by sputter target life), deposition plasma power, deposition time, temperature, pressure, gas flow, other parameters that may affect (for example, increase or decrease) the mean-free-path of the sputtered species, and the like. As shown in FIG. 4, the monitoring step 110 may communicate with the metal deposition processing (MDP) step 105 via the system communications bus 160. As shown in FIG. 4, the system communications bus 160 also provides communications between the metal deposition processing (MDP) step 105, the monitoring step 110, and the Advanced Process Control (APC) system 120, more fully described below.

Figure 5:
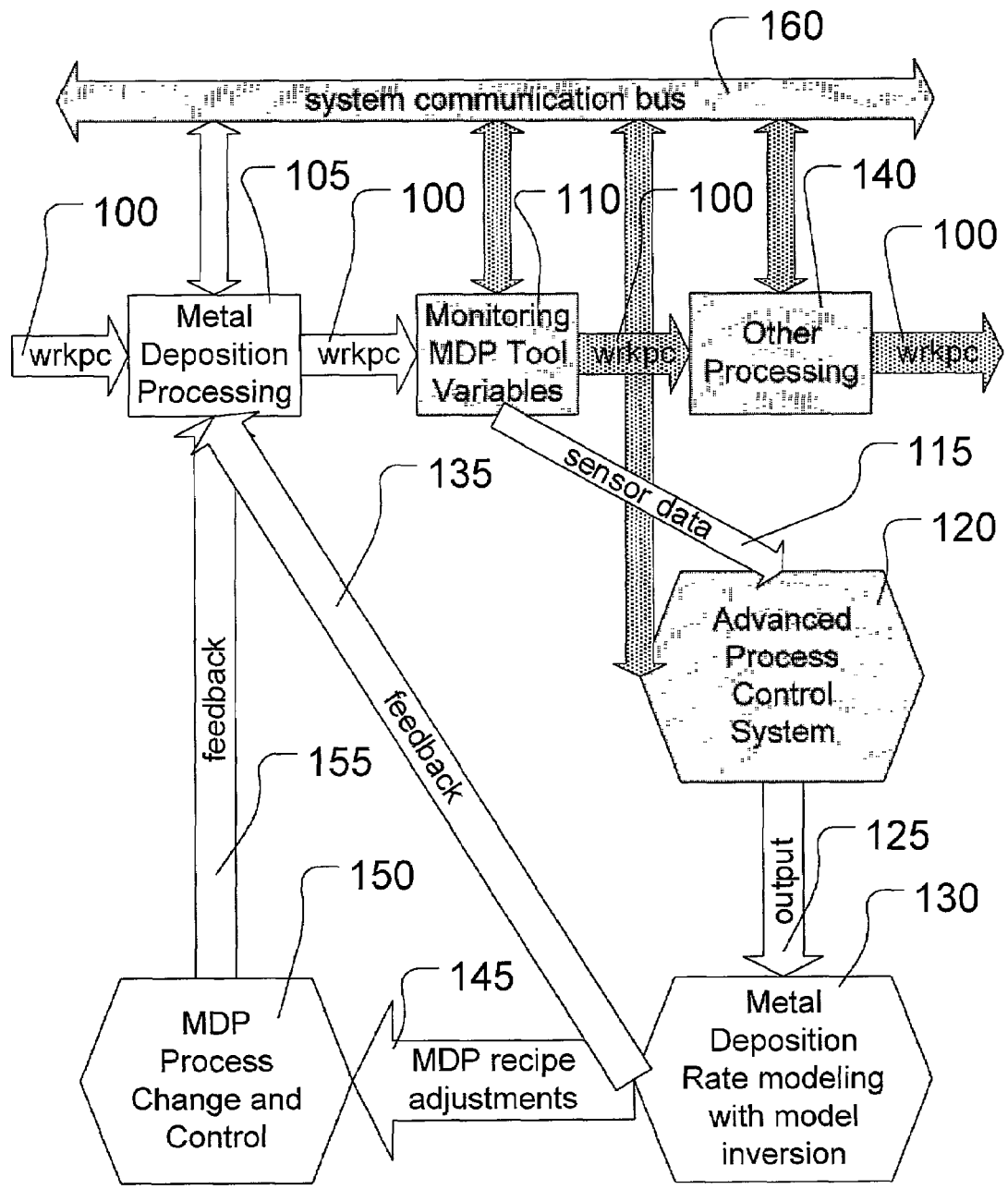

As shown in FIG. 5, the workpiece 100 is sent from the monitoring step 110 and delivered to the other processing steps 140. In the other processing steps 140, other processing steps may be performed on the workpiece 100 to produce the finished workpiece 100. In alternative illustrative embodiments, the workpiece 100 sent from the monitoring step 110 may be the finished workpiece 100, in which case, there may not be other processing steps 140. As shown in FIG. 5, the other processing steps 140 may communicate with the monitoring step 110 via the system communications bus 160. As shown in FIG. 5, the system communications bus 160 also provides communications between the monitoring step 110, the other processing steps 140, and the Advanced Process Control (APC) system 120, more fully described below.

Figure 6:
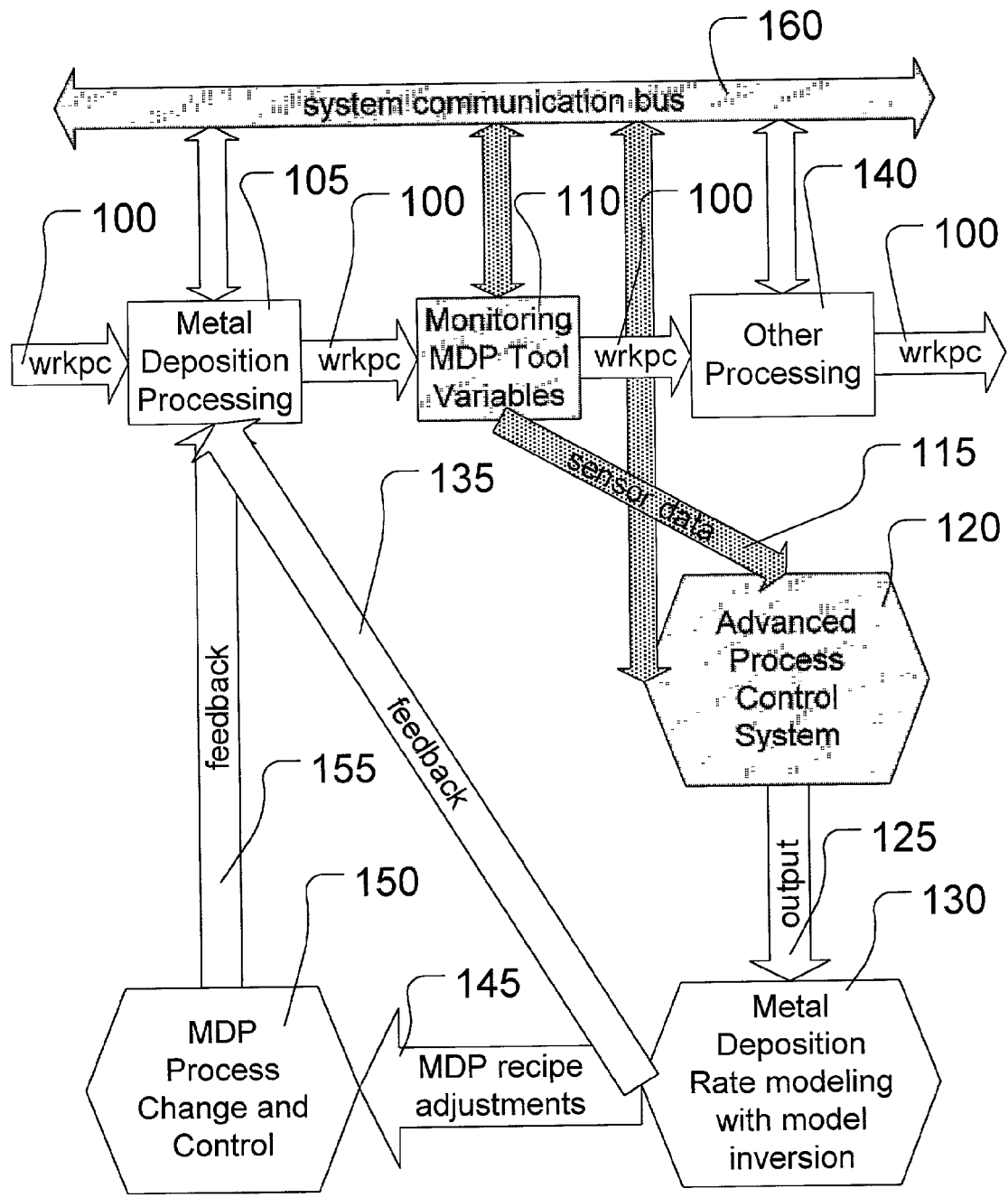

As shown in FIG. 6, the monitored sensor data 115 is sent from the monitoring step 110 and delivered to the Advanced Process Control (APC) system 120. As shown in FIG. 6, the Advanced Process Control (APC) system 120 may communicate with the monitoring step 110 via the system communications bus 160. Delivering the monitored sensor data 115 to the Advanced Process Control (APC) system 120 produces an output signal 125.

Figure 7:
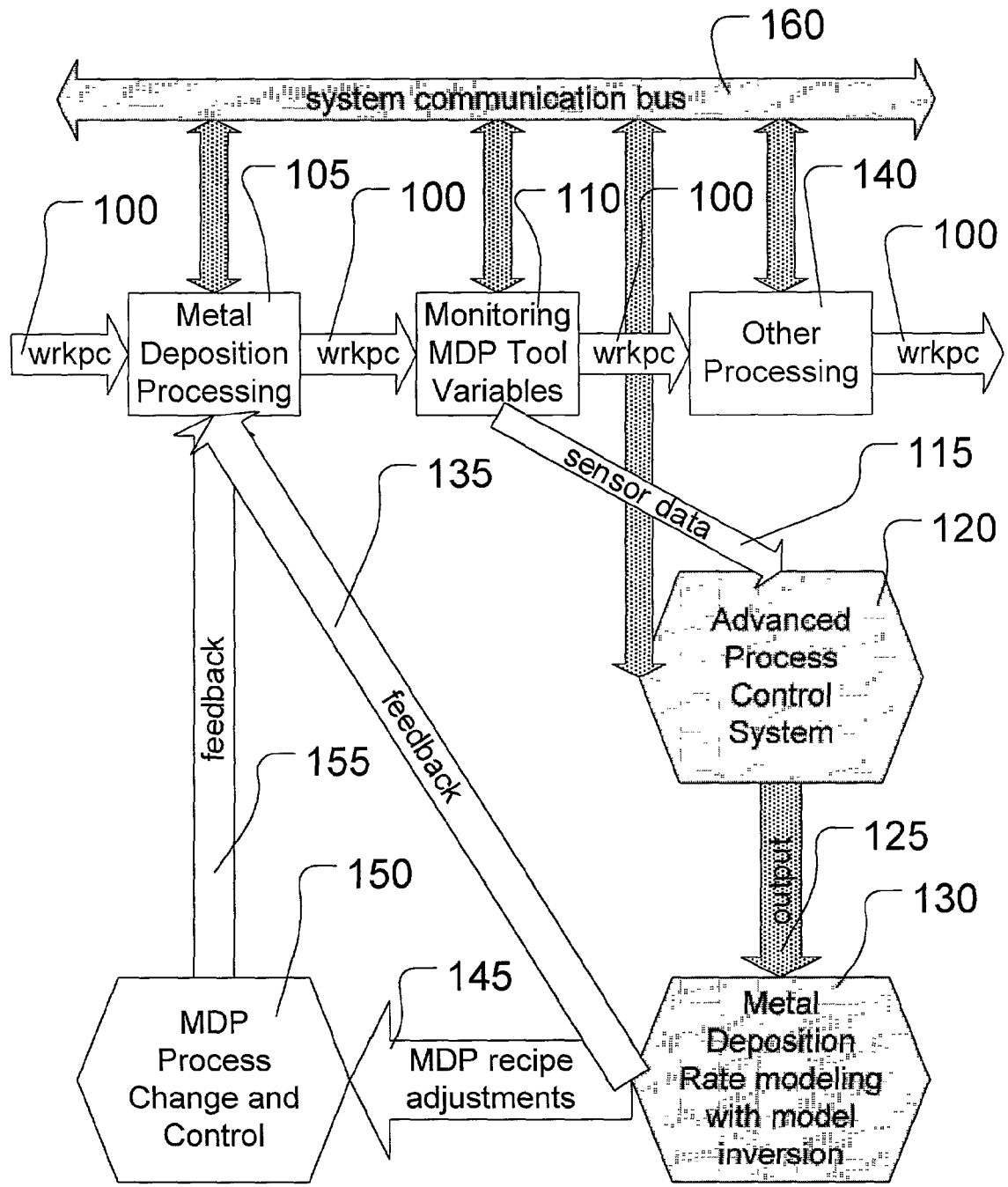

As shown in FIG. 7, the output signal 125 is sent from the Advanced Process Control (APC) system 120 and delivered to a metal deposition rate modeling with model inversion step 130. In the metal deposition rate modeling with model inversion step 130, the monitored sensor data 115 may be used in a metal deposition rate model, appropriate for the metal deposition processing (MDP) performed on the workpiece 100 in the metal deposition processing (MDP) step 105. Examples of such a metal deposition rate model, appropriate for metal deposition processing, may be provided by models empirically derived using MatLab®, Mathematica®, and the like. The use of the monitored sensor data 115 in a metal deposition rate model produces one or more metal deposition processing (MDP) recipe adjustments 145.

In various illustrative embodiments, a metal deposition rate model may be built. Such a metal deposition rate model may also be formed by monitoring one or more metal deposition processing (MDP) tool variables and/or one or more metal deposition processing (MDP) parameters during one or more metal deposition processing (MDP) runs. As described above, examples of such metal deposition processing (MDP) tool variables and/or metal deposition processing (MDP) parameters may comprise the degree of sputter target consumption (as measured by sputter target life), deposition plasma power, deposition time, temperature, pressure, gas flow, other parameters that may affect the mean-free-path of the sputtered species, and the like. In these various illustrative embodiments, building the metal deposition rate models may comprise fitting the collected processing data using at least one of polynomial curve fitting, least-squares fitting, polynomial least-squares fitting, non-polynomial least-squares fitting, weighted least-squares fitting, weighted polynomial least-squares fitting, weighted non-polynomial least-squares fitting, and the like, as described more fully below.

In various illustrative embodiments, the metal deposition rate model may incorporate model inversion capability. For example, the dependence of the deposition rate on the deposition plasma power, deposition time, and/or other variables may be adequately represented by: deposition rate=$f$(deposition plasma power, deposition time, . . . ). By inverting the model, the deposition plasma power and/or the deposition time that would be appropriate for a desired deposition rate may be determined. The deposition rate and the thickness of the metal layer may be related by: thickness=(deposition rate)(deposition time). Consequently, a deposited metal layer may be formed to have a desired thickness by inverting the deposition rate model, and choosing the deposition plasma power and/or the deposition time that would be appropriate for the desired deposition rate and, hence, the desired thickness.

For example, the dependence of the deposition rate on the deposition plasma power and the deposition time may be adequately represented by: $t=F(f,T)=f^\alpha T^\beta$, where the deposition rate is t, the deposition plasma power is $f$, the deposition time is T, and $\alpha$ and $\beta$ are exponents, determined by fitting measured data points, as described more fully below. The desired thickness $\theta$ of the metal layer may be given by: $\theta=tT=F(f,T)T=f^\alpha T^{\beta+1}$, for example. The variation in the deposition rate with variations in the deposition plasma power and the deposition time may be adequately represented by: $\delta t=\alpha f^{\alpha-1}T^\beta \delta f+\beta f^\alpha T^{\beta-1}\delta T$, for example. A deposited metal layer may be formed to have a desired thickness $\theta$ by inverting the deposition rate model, $t^{1/\alpha}=T^{\beta/\alpha}f$ and $t^{1/\beta}=f^{\alpha/\beta}T$, and choosing the deposition plasma power $f$ ($f=\theta^{1/\alpha}T^{-(\beta+1)/\alpha}$) and/or the deposition time T ($T=\theta^{1/(\beta+1)}f^{-\alpha/(\beta+1)}$) that would be appropriate for the desired deposition rate t, and, hence, the desired thickness $\theta$.

The metal deposition rate modeling of the monitored sensor data 115 in the metal deposition rate modeling with model inversion step 130, may be used to alert an engineer of the need to adjust the processing performed in any of the processing steps, such as the metal deposition processing (MDP) step 105 and/or the other processing steps 140. The engineer may also alter and/or adjust, for example, the setpoints for the metal deposition processing (MDP) performed in the metal deposition processing (MDP) step 105, and/or the metal deposition processing (MDP) tool variable(s) and/or metal deposition processing (MDP) parameter(s) monitored and/or measured in the monitoring step 110.

Figure 8:
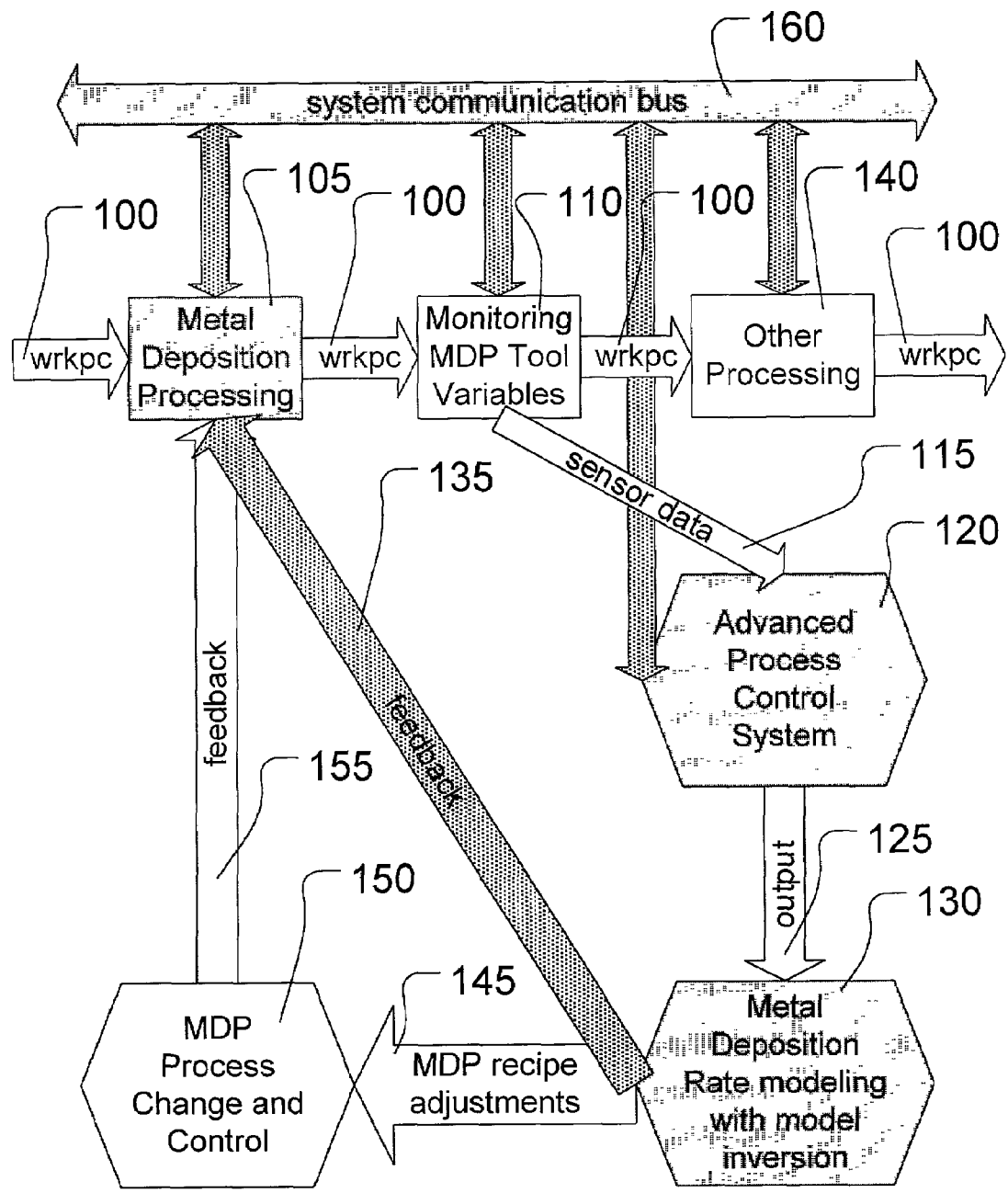

As shown in FIG. 8, a feedback control signal 135 may be sent from the metal deposition rate modeling with model inversion step 130 to the metal deposition processing (MDP) step 105 to adjust the metal deposition processing (MDP) performed in the metal deposition processing (MDP) step 105. For example, a deposited metal layer may be formed to have a desired thickness by inverting the deposition rate model, and choosing the deposition plasma power and/or the deposition time that would be appropriate for the desired deposition rate and, hence, the desired thickness. In various alternative illustrative embodiments, the feedback control signal 135 may be sent from the metal deposition rate modeling with model inversion step 130 to any of the other processing steps 140 to adjust the processing performed in any of the other processing steps 140, for example, via the system communications bus 160 that provides communications between the metal deposition processing (MDP) step 105, the monitoring step 110, the other processing steps 140, and the Advanced Process Control (APC) system 120, more fully described below.

Figure 9:
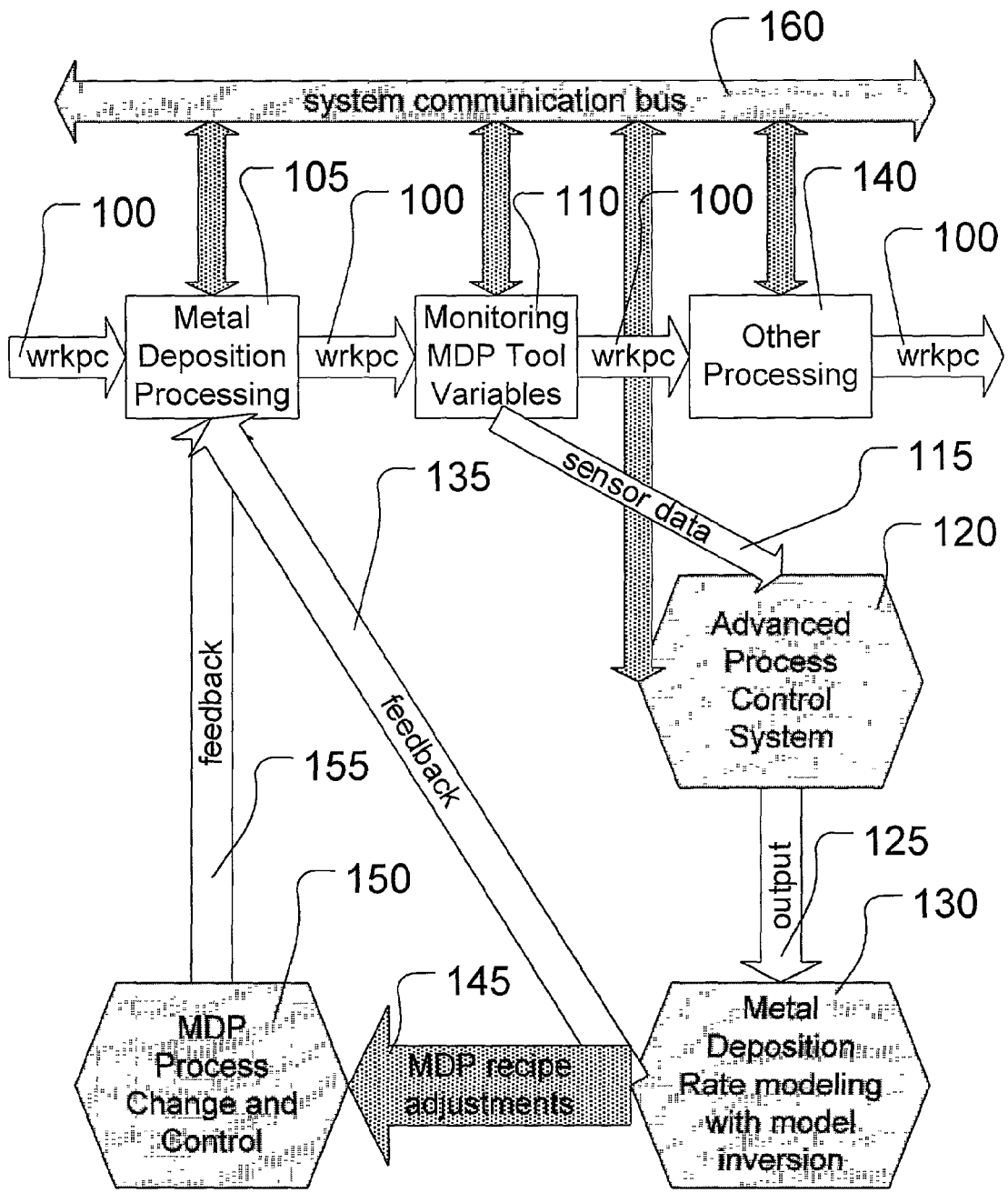
Figure 10:
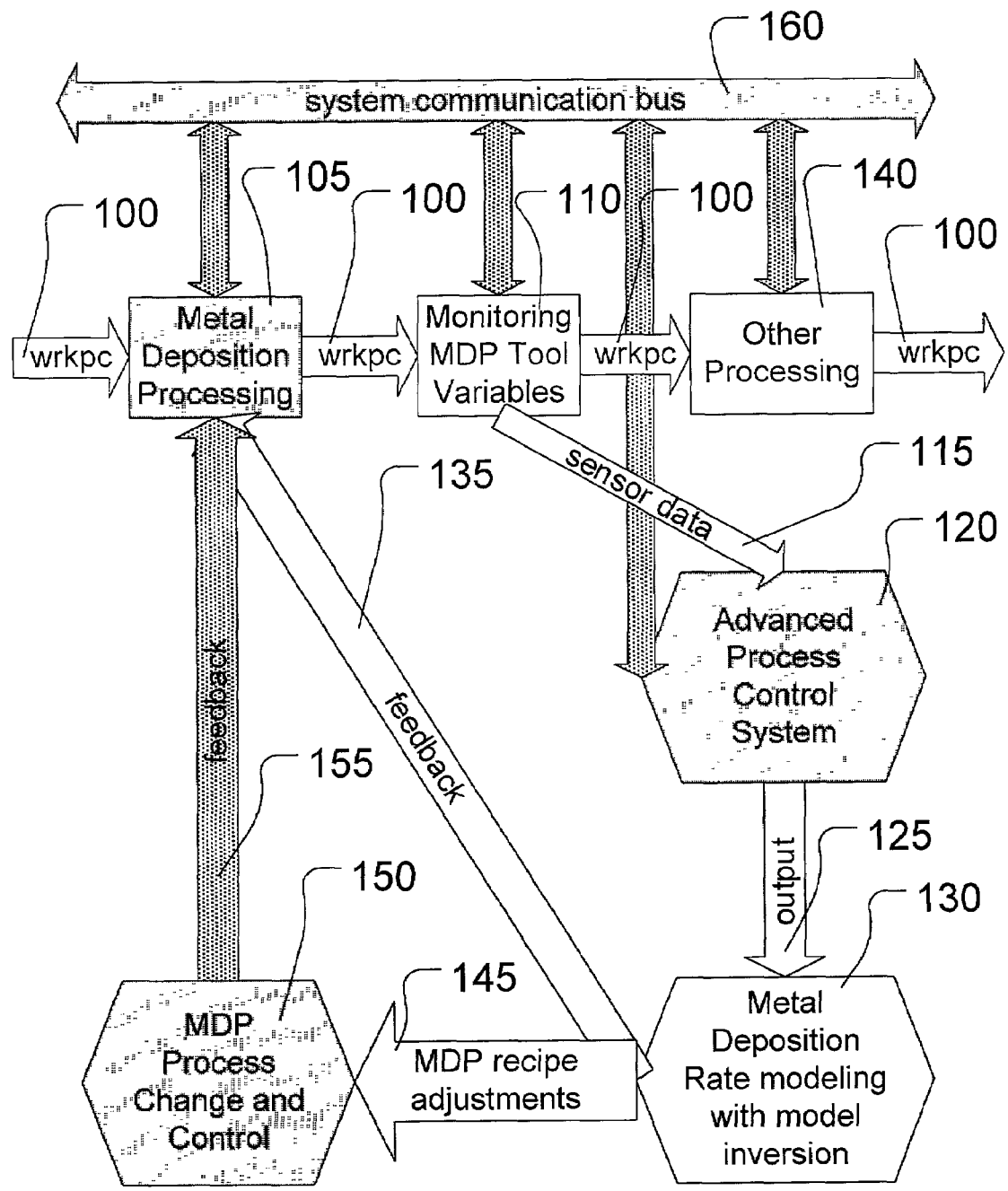

As shown in FIG. 9, in addition to, and/or instead of, the feedback control signal 135, the one or more metal deposition processing (MDP) recipe adjustments 145, and/or an entire appropriate recipe based upon this analysis, may be sent from the metal deposition rate modeling with model inversion step 130 to a metal deposition processing (MDP) process change and control step 150. In the metal deposition processing (MDP) process change and control step 150, the one or more metal deposition processing (MDP) recipe adjustments 145 may be used in a high-level supervisory control loop. Thereafter, as shown in FIG. 10, a feedback control signal 155 may be sent from the metal deposition processing (MDP) process change and control step 150 to the metal deposition processing (MDP) step 105 to adjust the metal deposition processing (MDP) performed in the metal deposition processing (MDP) step 105. For example, a deposited metal layer may be formed to have a desired thickness by inverting the deposition rate model, and choosing the deposition plasma power and/or the deposition time that would be appropriate for the desired deposition rate and, hence, the desired thickness. In various alternative illustrative embodiments, the feedback control signal 155 may be sent from the metal deposition processing (MDP) process change and control step 150 to any of the other processing steps 140 to adjust the processing performed in any of the other processing steps 140, for example, via the system communications bus 160 that provides communications between the metal deposition processing (MDP) step 105, the monitoring step 110, the other processing steps 140, and the Advanced Process Control (APC) system 120, more fully described below.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 11:
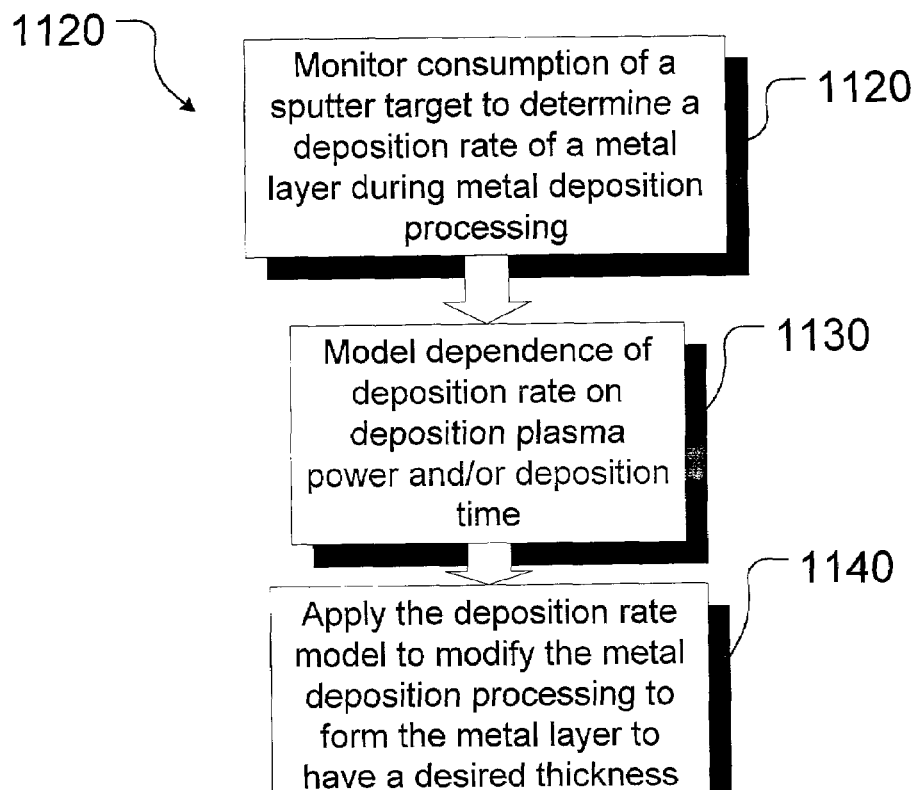
Figure 12:
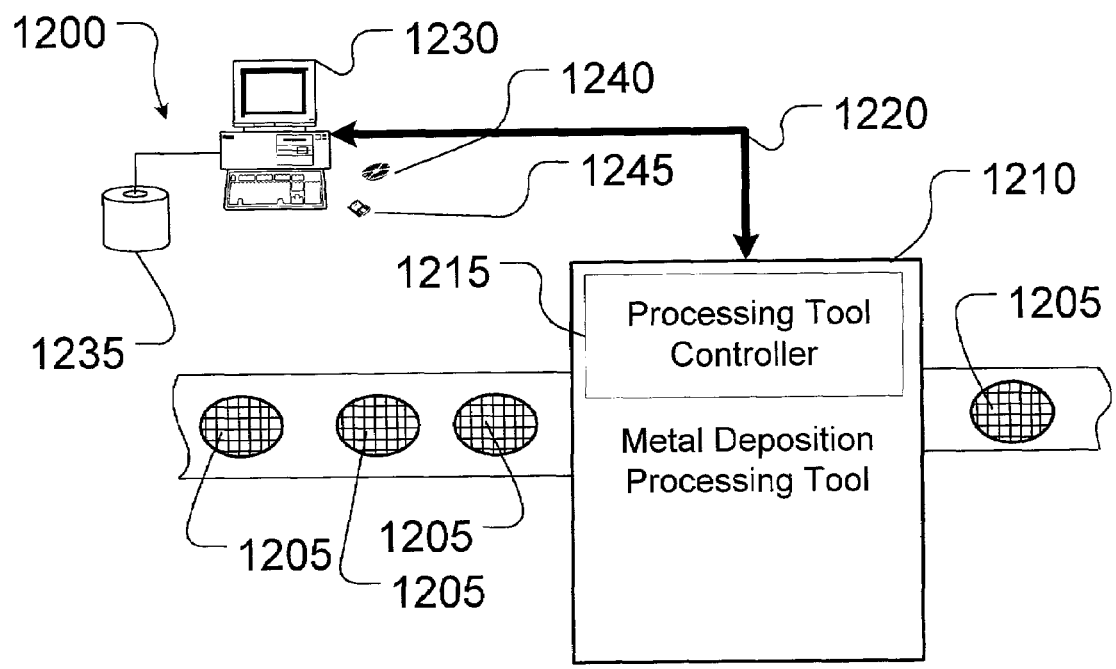

FIG. 11 illustrates one particular embodiment of a method 1100 practiced in accordance with the present invention. FIG. 12 illustrates one particular apparatus 1200 with which the method 1100 may be practiced. For the sake of clarity, and to further an understanding of the invention, the method 1100 shall be disclosed in the context of the apparatus 1200. However, the invention is not so limited and admits wide variation, as is discussed further below.

Referring now to both FIGS. 11 and 12, a batch or lot of workpieces or wafers 1205 is being processed through a metal deposition processing (MDP) tool 1210. The metal deposition processing (MDP) tool 1210 may be any metal deposition processing (MDP) tool known to the art, provided it comprises the requisite control capabilities. The metal deposition processing (MDP) tool 1210 comprises a metal deposition processing (MDP) tool controller 1215 for this purpose. The nature and function of the metal deposition processing (MDP) tool controller 1215 will be implementation specific.

For instance, the metal deposition processing (MDP) tool controller 1215 may control metal deposition processing (MDP) control input parameters such as metal deposition processing (MDP) recipe control input parameters and/or setpoints. Four workpieces 1205 are shown in FIG. 12, but the lot of workpieces or wafers, i.e., the "wafer lot," may be any practicable number of wafers from one to any finite number.

The method 1100 begins, as set forth in box 1120, by monitoring consumption of a sputter target to determine a deposition rate of a metal layer during metal deposition processing (MDP) performed on the workpiece 1205 in the metal deposition processing (MDP) tool 1210. The nature, identity, and measurement of characteristic parameters, such as deposition plasma power and/or deposition time and/or sputter target life, will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude. In turn, the metal deposition processing (MDP) control input parameters such as the metal deposition processing (MDP) recipe control input parameters and/or the setpoints for deposition plasma power and/or deposition time and/or flow rates of ambients (argon, Ar, for example) and/or chuck temperature and/or heat exchange temperature (for example, keeping one or more workpieces at approximately constant temperature, if possible) may directly affect the thickness of metal layers deposited on the workpiece 1205 and/or sputter target life.

Turning to FIG. 12, in this particular embodiment, the metal deposition processing (MDP) process characteristic parameters are measured and/or monitored by tool sensors (not shown). The outputs of these tool sensors are transmitted to a computer system 1230 over a line 1220. The computer system 1230 analyzes these sensor outputs to identify the characteristic parameters.

Returning, to FIG. 11, once the characteristic parameters are identified and measured, the method 1100 proceeds by modeling a dependence of the deposition rate on the deposition plasma power and/or the deposition time using a metal deposition rate model, as set forth in box 1130. As described above, examples of such a metal deposition rate model, appropriate for metal deposition processing, may be provided by models empirically derived using MatLab®, Mathematica®, and the like. The computer system 1230 in FIG. 12 is, in this particular embodiment, programmed to model the characteristic parameter(s). The manner in which this modeling occurs will be implementation specific.

In the embodiment of FIG. 12, a database 1235 stores a plurality of models that might potentially be applied, depending upon which characteristic parameter is measured. This particular embodiment, therefore, requires some a priori knowledge of the characteristic parameters that might be measured. The computer system 1230 then extracts an appropriate model from the database 1235 of potential models to apply to the measured characteristic parameters. If the database 1235 does not include an appropriate model, then the characteristic parameter may be ignored, or the computer system 1230 may attempt to develop one, if so programmed. The database 1235 may be stored on any kind of computer-readable, program storage medium, such as an optical disk 1240, a floppy disk 1245, or a hard disk drive (not shown) of the computer system 1230. The database 1235 may also be stored on a separate computer system (not shown) that interfaces with the computer system 1230.

Modeling of the measured characteristic parameter may be implemented differently in alternative embodiments. For instance, the computer system 1230 may be programmed using some form of artificial intelligence to analyze the sensor outputs and controller inputs to develop a model on-the-fly in a real-time implementation. This approach might be a useful adjunct to the embodiment illustrated in FIG. 12, and discussed above, where characteristic parameters are measured and identified for which the database 1235 has no appropriate model.

The method 1100 of FIG. 11 then proceeds by applying the deposition rate model to modify the metal deposition processing to form the metal layer to have a desired thickness, as set forth in box 1140. Depending on the implementation, applying the model may yield either a new value for a metal deposition processing (MDP) control input parameter or a correction to an existing metal deposition processing (MDP) control input parameter. In various illustrative embodiments, a multiplicity of control input recipes may be stored and an appropriate one of these may be selected based upon one or more of the determined parameters. The new metal deposition processing (MDP) control input is then formulated from the value yielded by the model and is transmitted to the metal deposition processing (MDP) tool controller 1215 over the line 1220. The metal deposition processing (MDP) tool controller 1215 then controls subsequent metal deposition processing (MDP) process operations in accordance with the new metal deposition processing (MDP) control inputs.

Some alternative embodiments may employ a form of feedback to improve the modeling of characteristic parameters. The implementation of this feedback is dependent on several disparate facts, including the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention may be implemented in software. For instance, the acts set forth in the boxes 1120-1140 in FIG. 11 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1245 or the computer 1230 hard disk drive (not shown), or optical, such as the optical disk 1240. When these instructions are executed by a computer, they perform the disclosed functions. The computer may be a desktop computer, such as the computer 1230. However, the computer might alternatively be a processor embedded in the metal deposition processing (MDP) tool 1210. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Figure 13:
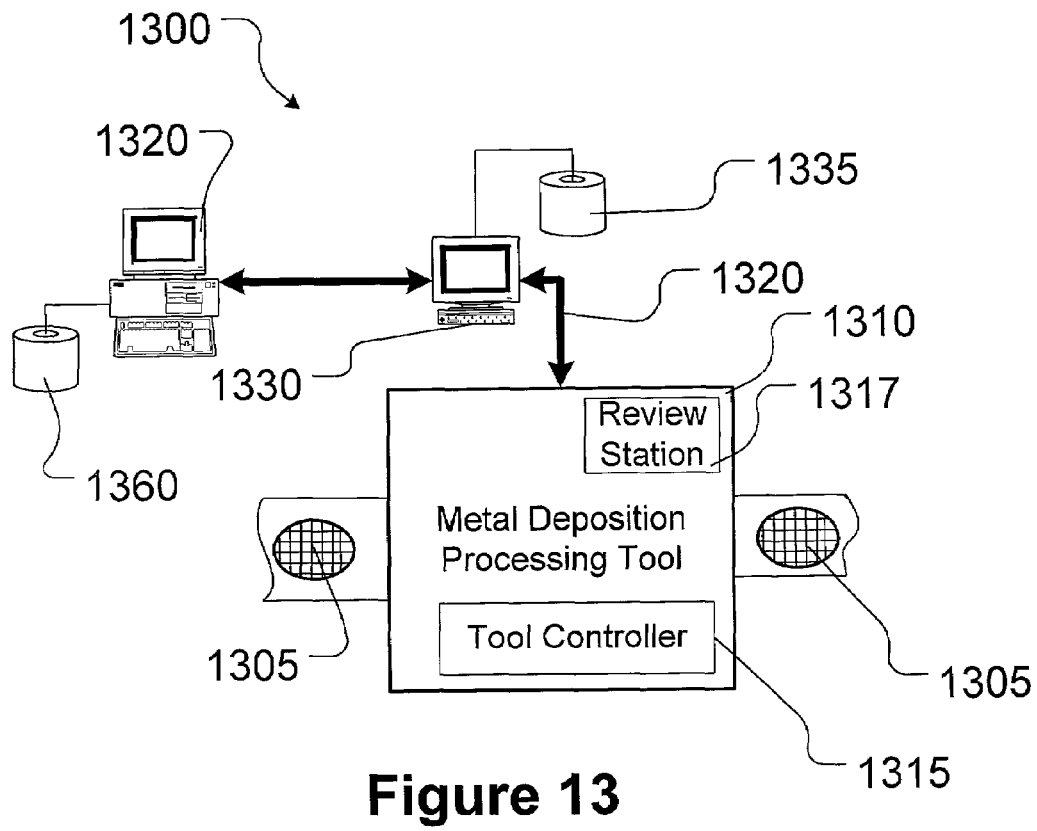
Figure 14:
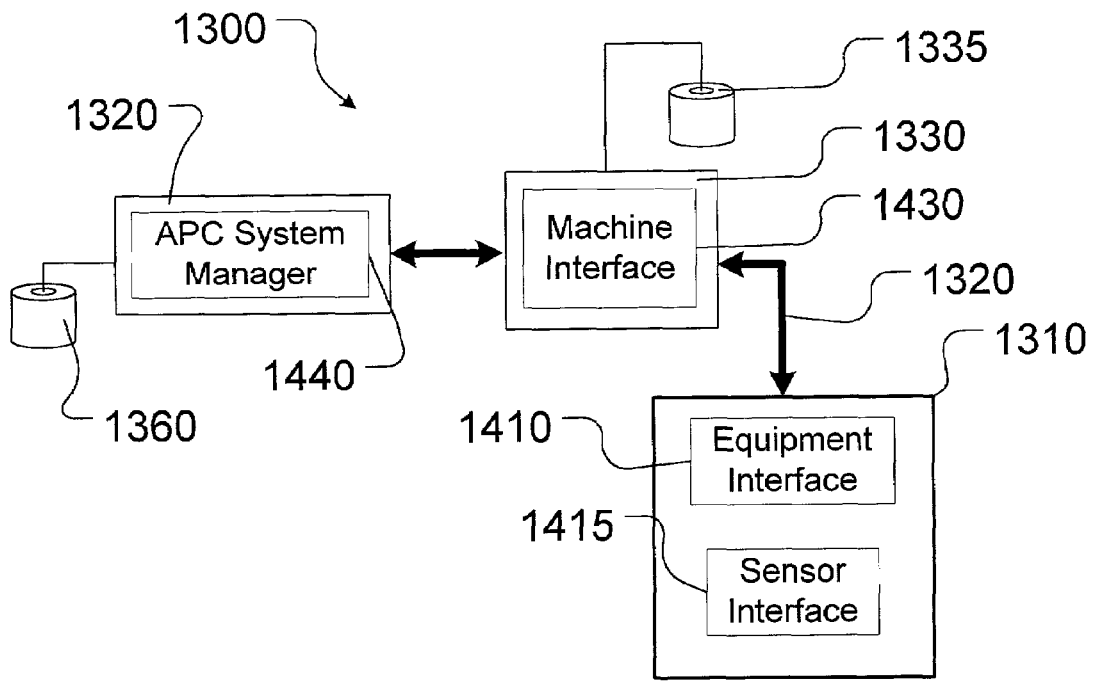

Construction of an Illustrative Apparatus. An exemplary embodiment 1300 of the apparatus 1200 in FIG. 12 is illustrated in FIGS. 13-14, in which the apparatus 1300 comprises a portion of an Advanced Process Control ("APC") system. FIGS. 13-14 are conceptualized, structural and functional block diagrams, respectively, of the apparatus 1300. A set of processing steps is performed on a lot of workpieces 1305 on a metal deposition processing (MDP) tool 1310. Because the apparatus 1300 is part of an Advanced Process Control (APC) system, the workpieces 1305 are processed on a run-to-run basis. Thus, process adjustments are made and held constant for the duration of a run, based on run-level measurements or averages. A "run" may be a lot, a batch of lots, or even an individual wafer.

In this particular embodiment, the workpieces 1305 are processed by the metal deposition processing (MDP) tool 1310 and various operations in the process are controlled by a plurality of metal deposition processing (MDP) control input signals on a line 1320 between the metal deposition processing (MDP) tool 1310 and a workstation 1330. Exemplary metal deposition processing (MDP) control inputs for this embodiment might include those for the setpoints for deposition plasma power, deposition time, temperature, pressure, gas flow, other parameters that may affect (for example, increase or decrease) the mean-free-path of the sputtered species, and the like.

When a process step in the metal deposition processing (MDP) tool 1310 is concluded, the semiconductor workpieces 1305 being processed in the metal deposition processing (MDP) tool 1310 are examined at a review station 1317. The metal deposition processing (MDP) control inputs generally affect the characteristic parameters of the semiconductor workpieces 1305 measured at the review station 1317, and, hence, the variability and properties of the acts performed by the metal deposition processing (MDP) tool 1310 on the workpieces 1305. Once errors are determined from the examination after the run of a lot of workpieces 1305, the metal deposition processing (MDP) control inputs on the line 1320 are modified for a subsequent run of a lot of workpieces 1305. Modifying the control signals on the line 1320 is designed to improve the next processing performed by the metal deposition processing (MDP) tool 1310. The modification is performed in accordance with one particular embodiment of the method 1100 set forth in FIG. 11, as described more fully below. Once the relevant metal deposition processing (MDP) control input signals for the metal deposition processing (MDP) tool 1310 are updated, the metal deposition processing (MDP) control input signals with new settings are used for a subsequent run of semiconductor devices.

Referring now to both FIGS. 13 and 14, the metal deposition processing (MDP) tool 1310 communicates with a manufacturing framework comprising a network of processing modules. One such module is an Advanced Process Control (APC) system manager 1440 resident on the computer 1340. This network of processing modules constitutes the Advanced Process Control (APC) system. The metal deposition processing (MDP) tool 1310 generally comprises an equipment interface 1410 and a sensor interface 1415. A machine interface 1430 resides on the workstation 1330. The machine interface 1430 bridges the gap between the Advanced Process Control (APC) framework, e.g., the Advanced Process Control (APC) system manager 1440, and the equipment interface 1410. Thus, the machine interface 1430 interfaces the metal deposition processing (MDP) tool 1310 with the Advanced Process Control (APC) framework and supports machine setup, activation, monitoring, and data collection. The sensor interface 1415 provides the appropriate interface environment to communicate with external sensors such as LabView® or other sensor bus-based data acquisition software. Both the machine interface 1430 and the sensor interface 1415 use a set of functionalities (such as a communication standard) to collect data to be used. The equipment interface 1410 and the sensor interface 1415 communicate over the line 1320 with the machine interface 1430 resident on the workstation 1330.

More particularly, the machine interface 1430 receives commands, status events, and collected data from the equipment interface 1410 and forwards these as needed to other Advanced Process Control (APC) components and event channels. In turn, responses from Advanced Process Control (APC) components are received by the machine interface 1430 and rerouted to the equipment interface 1410. The machine interface 1430 also reformats and restructures messages and data as necessary. The machine interface 1430 supports the startup/shutdown procedures within the Advanced Process Control (APC) System Manager 1440. It also serves as an Advanced Process Control (APC) data collector, buffering data collected by the equipment interface 1410, and emitting appropriate data collection signals.

In the particular embodiment illustrated, the Advanced Process Control (APC) system is a factory-wide software system, but this is not necessary to the practice of the invention. The control strategies taught by the present invention can be applied to virtually any semiconductor metal deposition processing (MDP) tool on a factory floor. Indeed, the present invention may be simultaneously employed on multiple metal deposition processing (MDP) tools in the same factory or in the same fabrication process. The Advanced Process Control (APC) framework permits remote access and monitoring of the process performance. Furthermore, by utilizing the Advanced Process Control (APC) framework, data storage can be more convenient, more flexible, and less expensive than data storage on local drives. However, the present invention may be employed, in some alternative embodiments, on local drives.

The illustrated embodiment deploys the present invention onto the Advanced Process Control (APC) framework utilizing a number of software components. In addition to components within the Advanced Process Control (APC) framework, a computer script is written for each of the semiconductor metal deposition processing (MDP) tools involved in the control system. When a semiconductor metal deposition processing (MDP) tool in the control system is started in the semiconductor manufacturing fab, the semiconductor metal deposition processing (MDP) tool generally calls upon a script to initiate the action that is required by the metal deposition processing (MDP) tool controller. The control methods are generally defined and performed using these scripts. The development of these scripts can comprise a significant portion of the development of a control system.

In this particular embodiment, there are several separate software scripts that perform the tasks involved in controlling the metal deposition processing (MDP) operation. There is one script for the metal deposition processing (MDP) tool 1310, including the review station 1317 and the metal deposition processing (MDP) tool controller 1315. There is also a script to handle the actual data capture from the review station 1317 and another script that contains common procedures that can be referenced by any of the other scripts. There is also a script for the Advanced Process Control (APC) system manager 1440. The precise number of scripts, however, is implementation specific and alternative embodiments may use other numbers of scripts.

Figure 15:
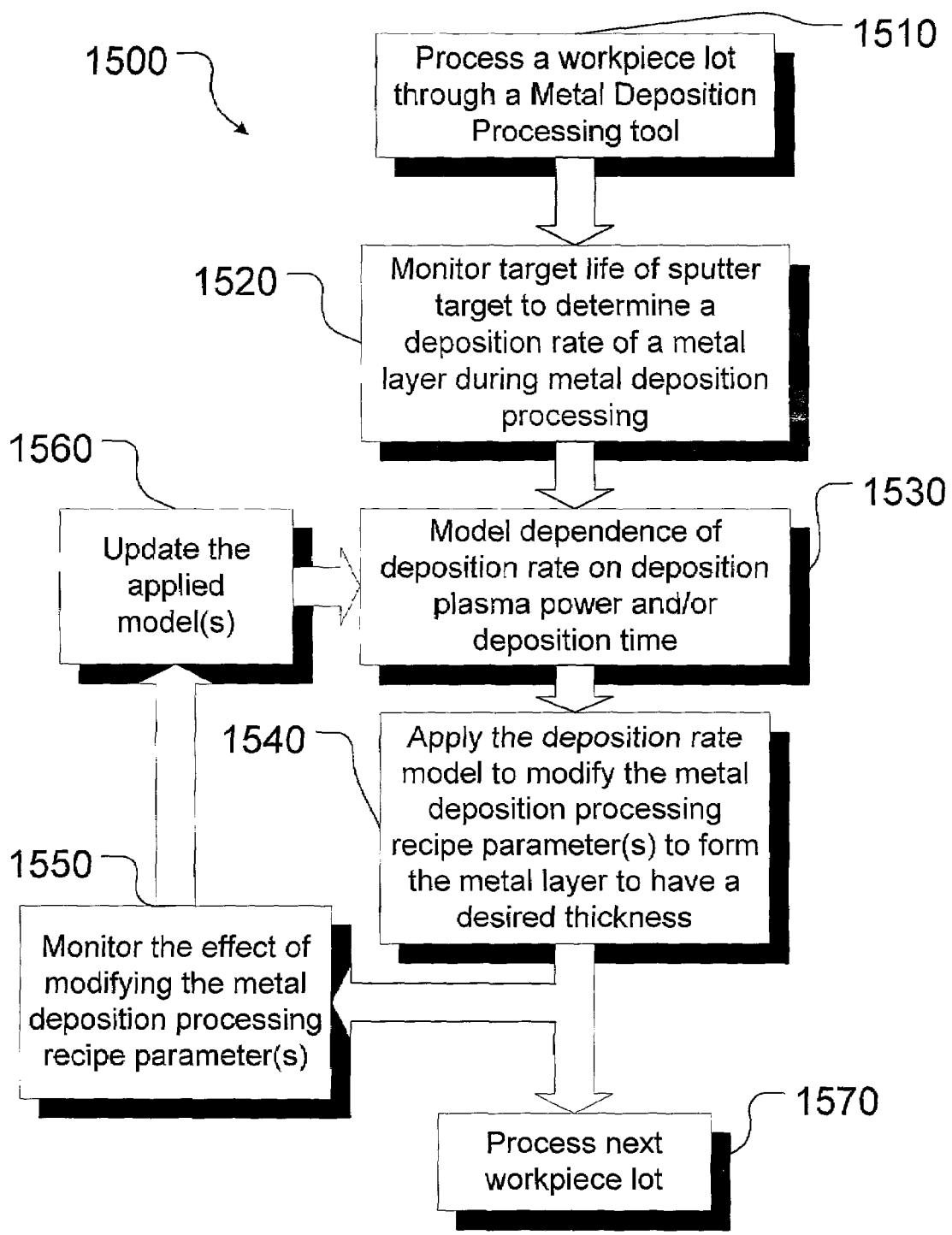

Operation of an Illustrative Apparatus. FIG. 15 illustrates one particular embodiment 1500 of the method 1100 in FIG. 11. The method 1500 may be practiced with the apparatus 1300 illustrated in FIGS. 13-14, but the invention is not so limited. The method 1500 may be practiced with any apparatus that may perform the functions set forth in FIG. 15. Furthermore, the method 1100 in FIG. 11 may be practiced in embodiments alternative to the method 1500 in FIG. 15.

Referring now to all of FIGS. 13-15, the method 1500 begins with processing a lot of workpieces 1305 through a metal deposition processing (MDP) tool, such as the metal deposition processing (MDP) tool 1310, as set forth in box 1510. In this particular embodiment, the metal deposition processing (MDP) tool 1310 has been initialized for processing by the Advanced Process Control (APC) system manager 1440 through the machine interface 1430 and the equipment interface 1410. In this particular embodiment, before the metal deposition processing (MDP) tool 1310 is run, the Advanced Process Control (APC) system manager script is called to initialize the metal deposition processing (MDP) tool 1310. At this step, the script records the identification number of the metal deposition processing (MDP) tool 1310 and the lot number of the workpieces 1305. The identification number is then stored against the lot number in a data store 1360. The rest of the script, such as the APCData call and the Setup and StartMachine calls, are formulated with blank or dummy data in order to force the machine to use default settings.

As part of this initialization, the initial setpoints for metal deposition processing (MDP) control are provided to the metal deposition processing (MDP) tool controller 1315 over the line 1320. These initial setpoints may be determined and implemented in any suitable manner known to the art. In the particular embodiment illustrated, metal deposition processing (MDP) controls are implemented by control threads. Each control thread acts like a separate controller and is differentiated by various process conditions. For metal deposition processing (MDP) control, the control threads are separated by a combination of different conditions. These conditions may include, for example, the semiconductor metal deposition processing (MDP) tool 1310 currently processing the wafer lot, the semiconductor product, the semiconductor manufacturing operation, and one or more of the semiconductor processing tools (not shown) that previously processed the semiconductor wafer lot.

Control threads are separated because different process conditions affect the metal deposition processing (MDP) error differently. By isolating each of the process conditions into its own corresponding control thread, the metal deposition processing (MDP) error can become a more accurate portrayal of the conditions in which a subsequent semiconductor wafer lot in the control thread will be processed. Since the error measurement is more relevant, changes to the metal deposition processing (MDP) control input signals based upon the error will be more appropriate.

The control thread for the metal deposition processing (MDP) control scheme depends upon the current metal deposition processing (MDP) tool, current operation, the product code for the current lot, and the identification number at a previous processing step. The first three parameters are generally found in the context information that is passed to the script from the metal deposition processing (MDP) tool 1310. The fourth parameter is generally stored when the lot is previously processed. Once all four parameters are defined, they are combined to form the control thread name; MDPP02_OPER01_PROD01_MDPP01 is an example of a control thread name. The control thread name is also stored in correspondence to the wafer lot number in the data store 1360.

Once the lot is associated with a control thread name, the initial settings for that control thread are generally retrieved from the data store 1360. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the metal deposition processing (MDP) as the metal deposition processing (MDP) control input settings. It is preferred that the controllers use the default machine settings as the initial settings. By assuming some settings, metal deposition processing (MDP) errors can be related back to the control settings to facilitate feedback control.

Another possibility is that the initial settings are stored under the control thread name. In this case, one or more wafer lots have been processed under the same control thread name as the current wafer lot, and have also been measured for metal deposition processing (MDP) error using the review station 1317. When this information exists, the metal deposition processing (MDP) control input signal settings are retrieved from the data store 1360. These settings are then downloaded to the metal deposition processing (MDP) tool 1310.

The workpieces 1305 are processed through the metal deposition processing (MDP) tool 1310. This comprises, in the embodiment illustrated, subjecting the workpieces 1305 to a metal deposition process. The workpieces 1305 are measured on the review station 1317 after their metal deposition processing (MDP) on the metal deposition processing (MDP) tool 1310. The review station 1317 examines the workpieces 1305 after they are processed for a number of errors. The data generated by the instruments of the review station 1317 is passed to the machine interface 1430 via sensor interface 1415 and the line 1320. The review station script begins with a number of Advanced Process Control (APC) commands for the collection of data. The review station script then locks itself in place and activates a data available script. This script facilitates the actual transfer of the data from the review station 1317 to the Advanced Process Control (APC) framework. Once the transfer is completed, the script exits and unlocks the review station script. The interaction with the review station 1317 is then generally complete.

As will be appreciated by those skilled in the art having the benefit of this disclosure, the data generated by the review station 1317 should be preprocessed for use. Review stations, such as KLA review stations, provide the control algorithms for measuring the control error. Each of the error measurements, in this particular embodiment, corresponds to one of the metal deposition processing (MDP) control input signals on the line 1320 in a direct manner. Before the error can be utilized to correct the metal deposition processing (MDP) control input signal, a certain amount of preprocessing is generally completed.

For example, preprocessing may include outlier rejection. Outlier rejection is a gross error check ensuring that the received data is reasonable in light of the historical performance of the process. This procedure involves comparing each of the metal deposition processing (MDP) errors to its corresponding predetermined boundary parameter. In one embodiment, even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Preprocessing may also smooth the data, which is also known as filtering. Filtering is important because the error measurements are subject to a certain amount of randomness, such that the error significantly deviates in value. Filtering the review station data results in a more accurate assessment of the error in the metal deposition processing (MDP) control input signal settings. In one embodiment, the metal deposition processing (MDP) control scheme utilizes a filtering procedure known as an Exponentially-Weighted Moving Average ("EWMA") filter, although other filtering procedures can be utilized in this context.

One embodiment for the EWMA filter is represented by Equation (1):

$$AVG_N = W*M_C + (1-W)*AVG_P \qquad (1)$$

where $AVG_N$=the new EWMA average;

W=a weight for the new average ($AVG_N$);

$M_C$=the current measurement; and $AVG_P$=the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through an metal deposition processing (MDP) tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the metal deposition processing (MDP) control input signal settings.

The metal deposition processing (MDP) tool controller 1315, in this particular embodiment, uses limited storage of data to calculate the EWMA filtered error, i.e., the first technique. Wafer lot data, including the lot number, the time the lot was processed, and the multiple error estimates, are stored in the data store 1360 under the control thread name. When a new set of data is collected, the stack of data is retrieved from data store 1360 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 128 hours old is removed. Once the aforementioned steps are complete, the new filter average is calculated and stored to data store 1360.

Thus, the data is collected and preprocessed, and then processed to generate an estimate of the current errors in the metal deposition processing (MDP) control input signal settings. First, the data is passed to a compiled MatLab® plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This comprises replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 15, data preprocessing comprises monitoring the target life of a sputter target to determine a deposition rate of a metal layer during metal deposition processing of the workpiece 1305 in the metal deposition processing (MDP) tool 1310 variables, as set forth in box 1520. Known, potential characteristic parameters, such as the target life of a sputter target, may be identified by characteristic data patterns or may be identified as known consequences of modifications to metal deposition processing (MDP) control. In turn, the metal deposition processing (MDP) control input parameters such as the metal deposition processing (MDP) recipe control input parameters and/or the setpoints for deposition plasma power and/or deposition time and/or flow rates of ambients and/or chuck temperature and/or heat exchange temperature may directly affect the sputter target life and/or the thickness of metal layers deposited on the workpiece 1205.

The next step in the control process is to calculate the new settings for the metal deposition processing (MDP) tool controller 1315 of the metal deposition processing (MDP) tool 1310. The previous settings for the control thread corresponding to the current wafer lot are retrieved from the data store 1360. This data is paired along with the current set of metal deposition processing (MDP) errors. The new settings are calculated by calling a compiled MatLab® plug-in. This application incorporates a number of inputs, performs calculations in a separate execution component, and returns a number of outputs to the main script. Generally, the inputs of the MatLab® plug-in are the metal deposition processing (MDP) control input signal settings, the review station 1317 errors, an array of parameters that are necessary for the control algorithm, and a currently unused flag error. The outputs of the MatLab® plug-in are the new controller settings, calculated in the plug-in according to the controller algorithm described above.

A metal deposition processing (MDP) process engineer or a control engineer, who generally determines the actual form and extent of the control action, can set the parameters. They include the threshold values, maximum step sizes, controller weights, and target values. Once the new parameter settings are calculated, the script stores the setting in the data store 1360 such that the metal deposition processing (MDP) tool 1310 can retrieve them for the next wafer lot to be processed. The principles taught by the present invention can be implemented into other types of manufacturing frameworks.

Returning again to FIG. 15, the calculation of new settings comprises, as set forth in box 1530, modeling the dependence of the deposition rate on the deposition plasma power and/or the deposition time characteristic parameter(s) using a metal deposition rate model. This modeling may be performed by the MatLab® plug-in. In this particular embodiment, only known, potential characteristic parameters are modeled and the models are stored in a database 1335 accessed by a machine interface 1430. The database 1335 may reside on the workstation 1330, as shown, or some other part of the Advanced Process Control (APC) framework. For instance, the models might be stored in the data store 1360 managed by the Advanced Process Control (APC) system manager 1440 in alternative embodiments. The model will generally be a mathematical model, i.e., an equation describing how the change(s) in metal deposition processing (MDP) recipe control(s) affects the metal deposition processing (MDP) performance, and the like. The models described in various illustrative embodiments given above, and described more fully below, are examples of such models. As described above, examples of such metal deposition rate models, appropriate for metal deposition processing, may be provided by models empirically derived using MatLab®, Mathematica®, and the like.

The particular model used will be implementation specific, depending upon the particular metal deposition processing (MDP) tool 1310 and the particular characteristic parameter(s) being modeled. Whether the relationship in the model is linear or non-linear will be dependent on the particular parameter(s) involved.

The new settings are then transmitted to and applied by the metal deposition processing (MDP) tool controller 1315. Thus, returning now to FIG. 15, once the characteristic parameter(s) are modeled, the deposition rate model is applied to modify the metal deposition processing recipe parameter(s) to form the metal layer to have a desired thickness, described more fully above, as set forth in box 1540. In this particular embodiment, the machine interface 1430 retrieves the model from the database 1335, plugs in the respective value(s), and determines the necessary change(s) in the metal deposition processing (MDP) recipe control input parameter(s). The change is then communicated by the machine interface 1430 to the equipment interface 1410 over the line 1320. The equipment interface 1410 then implements the change.

The present embodiment furthermore provides that the models be updated. This comprises, as set forth in boxes 1550-1560 of FIG. 15, monitoring the effect of modifying the metal deposition processing (MDP) recipe control input parameter(s) (box 1550) and updating the applied model(s) (box 1560) based on the effect(s) monitored. For instance, various aspects of the operation of the metal deposition processing (MDP) tool 1310 will change as the metal deposition processing (MDP) tool 1310 ages. By monitoring the effect of the metal deposition processing (MDP) recipe change(s) implemented as a result of the characteristic parameter measurement, the value(s) could be updated to yield improved performance.

As noted above, this particular embodiment implements an Advanced Process Control (APC) system. Thus, changes are implemented "between" lots. The actions set forth in the boxes 1520-1560 are implemented after the current lot is processed and before the second lot is processed, as set forth in box 1570 of FIG. 15. However, the invention is not so limited. Furthermore, as noted above, a lot may constitute any practicable number of wafers from one to several thousand (or practically any finite number). What constitutes a "lot" is implementation specific, and so the point of the fabrication process in which the updates occur will vary from implementation to implementation.

In various illustrative embodiments, the dependence of the deposition rate on the target life of the sputter target, the deposition plasma power, the deposition time, and the like, may be determined by modeling and/or fitting previously obtained metal deposition processing data. In these various illustrative embodiments, building the models may comprise fitting the collected processing data using at least one of polynomial curve fitting, least-squares fitting, polynomial least-squares fitting, non-polynomial least-squares fitting, weighted least-squares fitting, weighted polynomial least-squares fitting, and weighted non-polynomial least-squares fitting, and the like.

In various illustrative embodiments, samples may be collected for N+1 data points $(x_i, y_i)$, where i=1, 2, ..., N, N+1, and a polynomial of degree N, $$P_N(x) = a_0 + a_1 x + a_2 x^2 + \ldots + a_k x^k + \ldots + a_N x^N = \sum_{k=0}^{N} a_k x^k,$$

may be fit to the N+1 data points $(x_i, y_i)$. For example, 100 time data points (N=99) may be taken relating the degree of sputter target consumption, as measured by sputter target life p, the deposition plasma power $f$, and/or the deposition time T, during one or more metal deposition processing steps, to the deposition rate t of metal layers being formed during the respective one or more metal deposition processing steps, resulting in respective sets of N+1 data points $(p_i, t_i)$, $(f_i, t_i)$, and/or $(T_i, t_i)$. The values may be the actually measured values of the metal deposition processing tool variables and/or metal deposition processing parameters, or ratios of actually measured values (normalized to respective reference setpoints), or logarithms of such ratios, for example. Polynomial interpolation is described, for example, in *Numerical Methods for Scientists and Engineers*, by R. W. Hamming, Dover Publications, New York, 1986, at pages 230-235. The requirement that the polynomial $P_N(x)$ pass through the N+1 data points $(x_i, y_i)$ is $$y_i = P_N(x_i) = \sum_{k=0}^{N} a_k x_i^k,$$

for i=1, 2, ..., N, N+1, a set of N+1 conditions. These N+1 conditions then completely determine the N+1 coefficients $a_k$, for k=0, 1, ..., N.

The determinant of the coefficients of the unknown coefficients $a_k$ is the Vandermonde determinant:

$$V_{N+1} = \begin{vmatrix} 1 & x_1 & x_1^2 & \ldots & x_1^N \\ 1 & x_2 & x_2^2 & \ldots & x_2^N \\ \vdots & \vdots & \vdots & \ddots & \vdots \\ 1 & x_N & x_N^2 & \ldots & x_N^N \\ 1 & x_{N+1} & x_{N+1}^2 & \ldots & x_{N+1}^N \end{vmatrix} = |x_i^k|,$$

where i=1, 2, ..., N+1, and k=0, 1, ..., N. The Vandermonde determinant $V_{N+1}$, considered as a function of the variables $x_i$, $V_{N+1} = V_{N+1}(x_1, x_2, \ldots, x_N, x_{N+1})$, is clearly a polynomial in the variables $x_i$, as may be seen by expanding out the determinant, and a count of the exponents shows that the degree of the polynomial is $$0 + 1 + 2 + 3 + \ldots + k + \ldots + N = \sum_{k=0}^{N} k = \frac{N(N+1)}{2}$$

(for example, the diagonal term of the Vandermonde determinant $V_{N+1}$ is $1 \cdot x_2 \cdot x_3^2 \ldots x_N^{N-1} \cdot x_{N+1}^N$).

Now, if $x_{N+1} = x_j$, for j=1, 2, ..., N, then the Vandermonde determinant $V_{N+1} = 0$, since any determinant with two identical rows vanishes, so the Vandermonde determinant $V_{N+1}$ must have the factors $(x_{N+1} - x_j)$, for j=1, 2, ..., N, corresponding to the N factors $$\prod_{j=1}^{N} (x_{N+1} - x_j).$$

Similarly, if $x_N = x_j$, for j=1, 2, ..., N−1, then the Vandermonde determinant $V_{N+1} = 0$, so the Vandermonde determinant $V_{N+1}$ must also have the factors $(x_N - x_j)$, for j=1, 2, ..., N−1, corresponding to the N−1 factors $$\prod_{j=1}^{N-1} (x_N - x_j).$$

Generally, if $x_m = x_j$, for j<m, where m=2, ..., N, N+1, then the Vandermonde determinant $V_{N+1} = 0$, so the Vandermonde determinant $V_{N+1}$ must have all the factors $(x_m - x_j)$, for j<m, where m=2, ..., N, N+1, corresponding to the factors $$\prod_{m>j=1}^{N+1} (x_m - x_j).$$

Altogether, this represents a polynomial of degree $$N + (N-1) + \ldots + k + \ldots + 2 + 1 = \sum_{k=1}^{N} k = \frac{N(N+1)}{2},$$

since, when m=N+1, for example, j may take on any of N values, j=1, 2, ..., N, and when m=N, j may take on any of N−1 values, j=1, 2, ..., N−1, and so forth (for example, when m=3, j may take only two values, j=1, 2, and when m=2, j may take only one value, j=1), which means that all the factors have been accounted for and all that remains is to find any multiplicative constant by which these two representations for the Vandermonde determinant $V_{N+1}$ might differ. As noted above, the diagonal term of the Vandermonde determinant $V_{N+1}$ is $1 \cdot x_2 \cdot x_3^2 \ldots x_N^{N-1} \cdot x_{N+1}^N$, and this may be compared to the term from the left-hand sides of the product of factors $$\prod_{m>j=1}^{N+1} (x_m - x_j) =$$

$$\prod_{j=1}^{N} (x_{N+1} - x_j) \prod_{j=1}^{N-1} (x_N - x_j) \ldots \prod_{j=1}^{2} (x_3 - x_j) \prod_{j=1}^{1} (x_2 - x_j),$$

$x_{N+1}^N \cdot x_N^{N-1} \ldots x_3^2 \cdot x_2$, which is identical, so the multiplicative constant is unity and the Vandermonde determinant $$V_{N+1} \text{ is } V_{N+1}(x_1, x_2, \ldots, x_{N+1}) = |x_i^k| = \prod_{m>j=1}^{N+1} (x_m - x_j).$$

This factorization of the Vandermonde determinant $V_{N+1}$ shows that if $x_i \neq x_j$, for $i \neq j$, then the Vandermonde determinant $V_{N+1}$ cannot be zero, which means that it is always possible to solve for the unknown coefficients $a_k$, since the Vandermonde determinant $V_{N+1}$ is the determinant of the coefficients of the unknown coefficients $a_k$. Solving for the unknown coefficients $a_k$, using determinants, for example, substituting the results into the polynomial of degree N, $$P_N(x) = \sum_{k=0}^{N} a_k x^k,$$

and rearranging suitably gives the determinant equation $$\begin{vmatrix} y & 1 & x & x^2 & \ldots & x^N \\ y_1 & 1 & x_1 & x_1^2 & \ldots & x_1^N \\ y_2 & 1 & x_2 & x_2^2 & \ldots & x_2^N \\ \vdots & \vdots & \vdots & \vdots & \ddots & \vdots \\ y_N & 1 & x_N & x_N^2 & \ldots & x_N^N \\ y_{N+1} & 1 & x_{N+1} & x_{N+1}^2 & \ldots & x_{N+1}^N \end{vmatrix} = 0,$$

which is the solution to the polynomial fit. This may be seen directly as follows. Expanding this determinant by the elements of the top row, this is clearly a polynomial of degree N. The coefficient of the element y in the first row in the expansion of this determinant by the elements of the top row is none other than the Vandermonde determinant $V_{N+1}$. In other words, the cofactor of the element y in the first row is, in fact, the Vandermonde determinant $V_{N+1}$. Indeed, the cofactor of the nth element in the first row, where n=2, ..., N+2, is the product of the coefficient $a_{n-2}$ in the polynomial expansion $$y = P_N(x) = \sum_{k=0}^{N} a_k x^k$$

with the Vandermonde determinant $V_{N+1}$. Furthermore, if x and y take on any of the sample values $x_i$ and $y_i$, for i=1, 2, ..., N, N+1, then two rows of the determinant would be the same and the determinant must then vanish. Thus, the requirement that the polynomial $y = P_N(x)$ pass through the N+1 data points $(x_i, y_i)$, $$y_i = P_N(x_i) = \sum_{k=0}^{N} a_k x_i^k,$$

for i=1, 2, ..., N, N+1, is satisfied.

For example, a quadratic curve may be found that goes through the sample data set (−1,a), (0,b), and (1,c). The three equations are $P_2(-1)=a=a_0-a_1+a_2$, $P_2(0)=b=a_0$, and $P_2(1)=c=a_0+a_1+a_2$, which imply that $b=a_0$, $c-a=2a_1$, and $c+a-2b=2a_2$, so that $$y(x) = P_2(x) = b + \frac{c-a}{2}x + \frac{c+a-2b}{2}x^2,$$

which is also the result of expanding $$\begin{vmatrix} y & 1 & x & x^2 \\ a & 1 & -1 & 1 \\ b & 1 & 0 & 0 \\ c & 1 & 1 & 1 \end{vmatrix} =$$

$$0 = y\begin{vmatrix} 1 & -1 & 1 \\ 1 & 0 & 0 \\ 1 & 1 & 1 \end{vmatrix} - \begin{vmatrix} a & -1 & 1 \\ b & 0 & 0 \\ c & 1 & 1 \end{vmatrix} + x\begin{vmatrix} a & 1 & 1 \\ b & 1 & 0 \\ c & 1 & 1 \end{vmatrix} - x^2\begin{vmatrix} a & 1 & -1 \\ b & 1 & 0 \\ c & 1 & 1 \end{vmatrix},$$

the coefficient of y being the respective Vandermonde determinant $V_3=2$.

Similarly, a quartic curve may be found that goes through the sample data set (−2,a), (−1,b), (0,c), (1,b), and (2,a). The five equations are $P_4(-2)=a=a_0-2a_1+4a_2-8a_3+16a_4$, $P_4(-1)=b=a_0-a_1+a_2-a_3+a_4$, $P_4(0)=c=a_0$, $P_4(1)=b=a_0+a_1+a_2+a_3+a_4$, and $P_4(2)=a=a_0+2a_1+4a_2+8a_3+16a_4$, which imply that $c=a_0$, $0=a_1=a_3$ (which also follows from the symmetry of the data set), $(a-c)-16(b-c)=-12a_2$, and $(a-c)-4(b-c)=12a_4$, so that $$y(x) = P_4(x) = c - \frac{a-16b+15c}{12}x^2 + \frac{a-4b+3c}{12}x^4.$$

In various alternative illustrative embodiments, samples may be collected for M data points $(x_i, y_i)$, where i=1, 2, ..., M, and a first degree polynomial (a straight line), $$P_1(x) = a_0 + a_1 x = \sum_{k=0}^{1} a_k x^k,$$

may be fit (in a least-squares sense) to the M data points $(x_i, y_i)$. For example, 100 time data points (M=100) may be taken relating the degree of sputter target consumption, as measured by sputter target life p, the deposition plasma power f, and/or the deposition time T, during one or more metal deposition processing steps, to the deposition rate t of metal layers being formed during the respective one or more metal deposition processing steps, resulting in the M data points $(p_i, t_i)$, $(f_i, t_i)$, and/or $(T_i, t_i)$. The values may be the actually measured values of the metal deposition processing tool variables and/or metal deposition processing parameters, or ratios of actually measured values (normalized to respective reference setpoints), or logarithms of such ratios, for example. Least-squares fitting is described, for example, in *Numerical Methods for Scientists and Engineers*, by R. W. Hamming, Dover Publications, New York, 1986, at pages 427-443.

The least-squares criterion may be used in situations where there is much more data available than parameters so that exact matching (to within round-off) is out of the question. Polynomials are most commonly used in least-squares matching, although any linear family of suitable functions may work as well. Suppose some quantity x is being measured by making M measurements $x_i$, for $i=1, 2, \ldots, M$, and suppose that the measurements $x_i$, are related to the "true" quantity x by the relation $x_i = x + \epsilon_i$, for $i=1, 2, \ldots, M$, where the residuals $\epsilon_i$ are regarded as noise. The principle of least-squares states that the best estimate $\xi$ of the true value x is the number that minimizes the sum of the squares of the deviations of the data from their estimate $$f(\xi) = \sum_{i=1}^{M} \varepsilon_i^2 = \sum_{i=1}^{M} (x_i - \xi)^2,$$

which is equivalent to the assumption that the average $x_a$, where $$x_a = \frac{1}{M} \sum_{i=1}^{M} x_i,$$

is the best estimate $\xi$ of the true value x. This equivalence may be shown as follows. First, the principle of least-squares leads to the average $x_a$. Regarding $$f(\xi) = \sum_{i=1}^{M} \varepsilon_i^2 = \sum_{i=1}^{M} (x_i - \xi)^2$$

as a function of the best estimate $\xi$, minimization with respect to the best estimate $\xi$ may proceed by differentiation:

$$\frac{df(\xi)}{d\xi} = -2\sum_{i=1}^{M} (x_i - \xi) = 0,$$

which implies that so that $$\sum_{i=1}^{M} x_i - \sum_{i=1}^{M} \xi = 0 = \sum_{i=1}^{M} x_i - M\xi,$$

so that $$\xi = \frac{1}{M} \sum_{i=1}^{M} x_i = x_a,$$

or, in other words, that the choice $x_a = \xi$ minimizes the sum of the squares of the residuals $\epsilon_i$. Noting also that $$\frac{d^2 f(\xi)}{d\xi^2} = 2\sum_{i=1}^{M} 1 = 2M > 0,$$

the criterion for a minimum is established.

Conversely, if the average $x_a$ is picked as the best choice $x_a = \xi$, it can be shown that this choice, indeed, minimizes the sum of the squares of the residuals $\epsilon_i$. Set $$f(x_a) = \sum_{i=1}^{M} (x_i - x_a)^2 =$$

$$\sum_{i=1}^{M} x_i^2 - 2x_a \sum_{i=1}^{M} x_i + \sum_{i=1}^{M} x_a^2 = \sum_{i=1}^{M} x_i^2 - 2x_a M x_a + M x_a^2 = \sum_{i=1}^{M} x_i^2 - M x_a^2.$$

If any other value $x_b$ is picked, then, plugging that other value $x_b$ into $f(x)$ gives $$f(x_b) =$$

$$\sum_{i=1}^{M} (x_i - x_b)^2 = \sum_{i=1}^{M} x_i^2 - 2x_b \sum_{i=1}^{M} x_i + \sum_{i=1}^{M} x_b^2 = \sum_{i=1}^{M} x_i^2 - 2x_b M x_a + M x_b^2.$$

Subtracting $f(x_a)$ from $f(x_b)$ gives $f(x_b) - f(x_a) = M[x_a^2 - 2x_a x_b + x_b^2] = M(x_a - x_b)^2 \geq 0$, so that $f(x_b) \geq f(x_a)$, with equality if, and only if, $x_b = x_a$. In other words, the average $x_a$, indeed, minimizes the sum of the squares of the residuals $\epsilon_i$. Thus, it has been shown that the principle of least-squares and the choice of the average as the best estimate are equivalent.

There may be other choices besides the least-squares choice. Again, suppose some quantity x is being measured by making M measurements $x_i$, for $i=1, 2, \ldots, M$, and suppose that the measurements $x_i$, are related to the "true" quantity x by the relation $x_i = x + \epsilon_i$, for $i=1, 2, \ldots, M$, where the residuals $\epsilon_i$ are regarded as noise. An alternative to the least-squares choice may be that another estimate $\chi$ of the true value x is the number that minimizes the sum of the absolute values of the deviations of the data from their estimate $$f(x) = \sum_{i=1}^{M} |\varepsilon_i| = \sum_{i=1}^{M} |x_i - \chi|,$$

which is equivalent to the assumption that the median or middle value $x_m$ of the M measurements $x_i$, for $i=1, 2, \ldots, M$ (if M is even, then average the two middle values), is the other estimate $\chi$ of the true value x. Suppose that there are an odd number $M=2k+1$ of measurements $x_i$, for $i=1, 2, \ldots, M$, and choose the median or middle value $x_m$ as the estimate $\chi$ of the true value x that minimizes the sum of the absolute values of the residuals $\epsilon_i$. Any upward shift in this value $x_m$ would increase the k terms $|x_i-x|$ that have $x_i$ below $x_m$, and would decrease the k terms $|x_i-x|$ that have $x_i$ above $x_m$, each by the same amount. However, the upward shift in this value $x_m$ would also increase the term $|x_m-x|$ and, thus, increase the sum of the absolute values of all the residuals $\epsilon_i$. Yet another choice, instead of minimizing the sum of the squares of the residuals $\epsilon_i$, would be to choose to minimize the maximum deviation, which leads to $$\frac{x_{\min} + x_{\max}}{2} = x_{midrange},$$

the midrange estimate of the best value.

Returning to the various alternative illustrative embodiments in which samples may be collected for M data points $(x_i, y_i)$, where $i=1, 2, \ldots, M$, and a first degree polynomial (a straight line), $$P_1(x) = a_0 + a_1 x = \sum_{k=0}^{1} a_k x^k,$$

may be fit (in a least-squares sense) to the M data points $(x_i, y_i)$, there are two parameters, $a_0$ and $a_1$, and a function $F(a_0, a_1)$ that needs to be minimized as follows. The function $F(a_0, a_1)$ is given by $$F(a_0, a_1) = \sum_{i=1}^{M} \varepsilon_i^2 = \sum_{i=1}^{M} [P_1(x_i) - y_i]^2 = \sum_{i=1}^{M} [a_0 + a_1 x_i - y_i]^2$$

and setting the partial derivatives of $F(a_0, a_1)$ with respect to $a_0$ and $a_1$ equal to zero gives $$\frac{\partial F(a_0, a_1)}{\partial a_0} = 2\sum_{i=1}^{M} [a_0 + a_1 x_i - y_i] = 0$$

and $$\frac{\partial F(a_0, a_1)}{\partial a_0} = 2\sum_{i=1}^{M} [a_0 + a_1 x_i - y_i] x_i = 0,$$

respectively. Simplifying and rearranging gives $$a_0 M + a_1 \sum_{i=1}^{M} x_i = \sum_{i=1}^{M} y_i \text{ and } a_0 \sum_{i=1}^{M} x_i + a_1 \sum_{i=1}^{M} x_i^2 = \sum_{i=1}^{M} x_i y_i,$$

respectively, where there are two equations for the two unknown parameters $a_0$ and $a_1$, readily yielding a solution.

Figure 16:
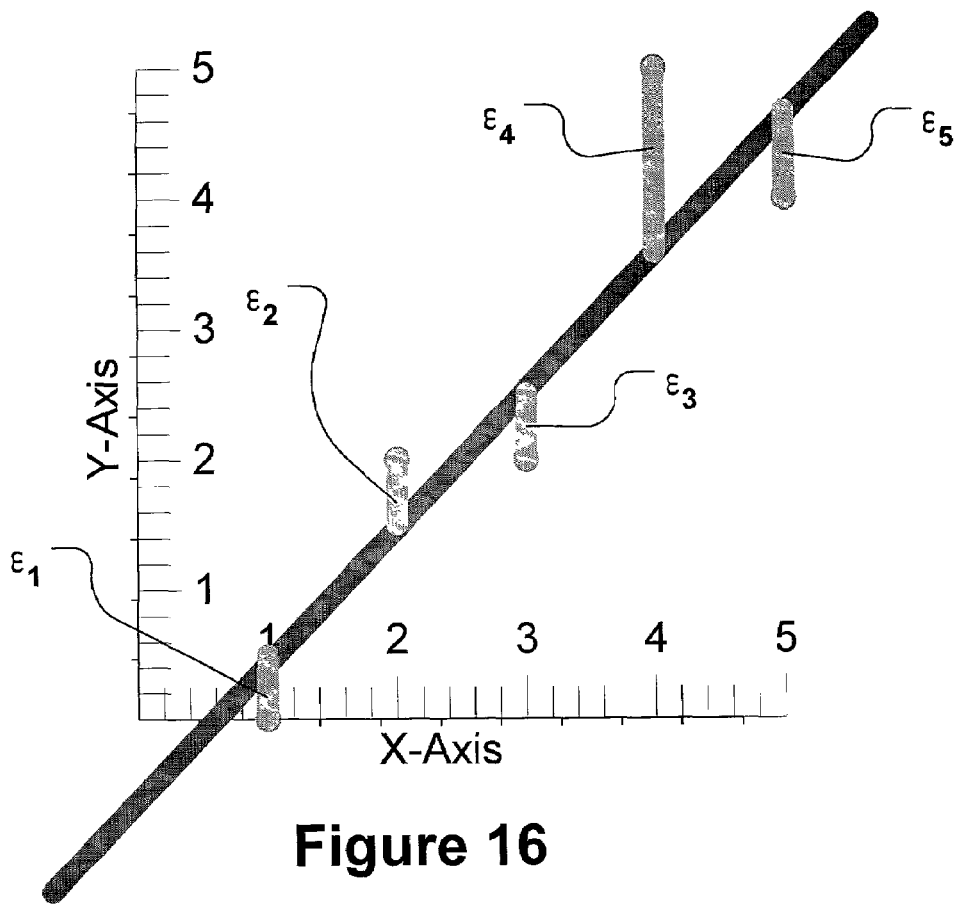

As shown in FIG. 16, for example, a first degree polynomial (a straight line), $$P_1(x) = a_0 + a_1 x = \sum_{k=0}^{1} a_k x^k,$$

may be fit (in a least-squares sense) to the M=5 data points (1,0), (2,2), (3,2), (4,5), and (5,4). The residuals $\epsilon_i$, for $i=1, 2, \ldots, 5$, are schematically illustrated in FIG. 16. The equations for the two parameters $a_0$ and $a_1$ are $5a_0+15a_1=13$ and $15a_0+55a_1=50$, respectively, so that, upon multiplying the first equation by 3 and then subtracting that from the second equation, thereby eliminating $a_0$, the solution for the parameter $a_1$ becomes $a_1=11/10$, and this implies that the solution for the parameter $a_0$ becomes $a_0=-7/10$. The first degree polynomial (the straight line) that provides the best fit, in the least-squares sense, is $P_1(x)=-7/10+11/10x=1/10(-7+11x)$, as shown in FIG. 16.

Figure 17:
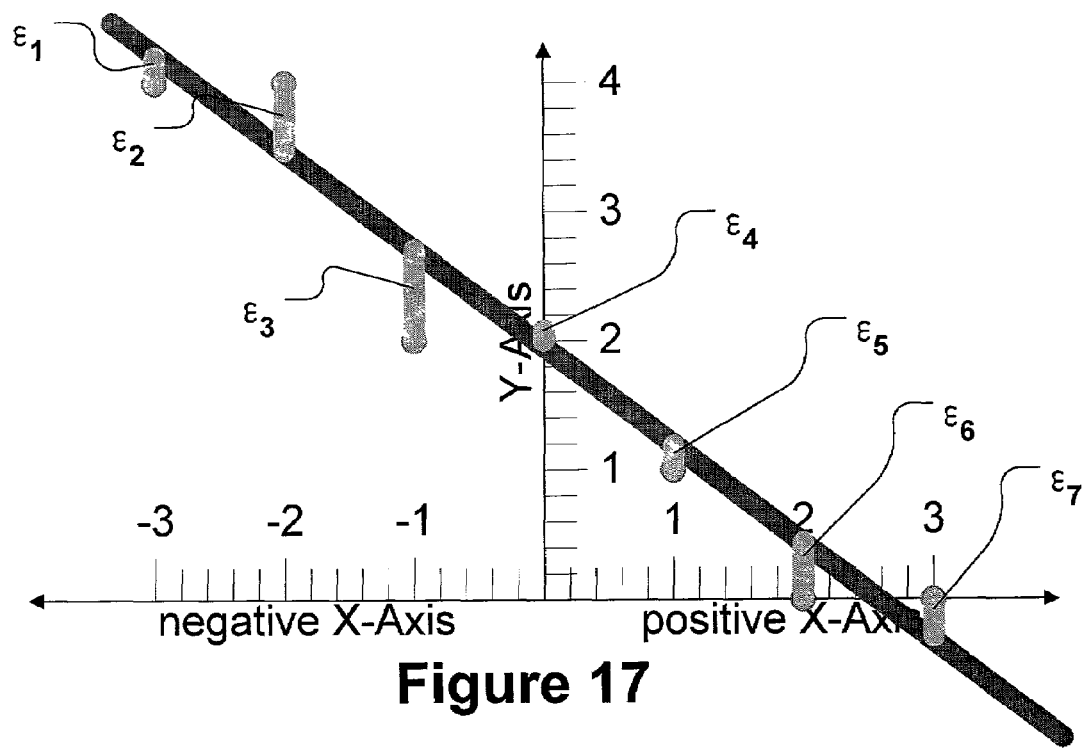

As shown in FIG. 17, for example, a first degree polynomial (a straight line), $$P_1(x) = a_0 + a_1 x = \sum_{k=0}^{1} a_k x^k,$$

may be fit (in a least-squares sense) to the M=7 data points (−3,4), (−2,4), (−1,2), (0,2), (1,1), (2,0), and (3,0). The residuals $\epsilon_i$, for $i=1, 2, \ldots, 7$, are schematically illustrated in FIG. 17. The equations for the two parameters $a_0$ and $a_1$ are $$a_0 M + a_1 \sum_{i=1}^{M} x_i =$$

$$\sum_{i=1}^{M} y_i = 7a_0 + a_1(-3 - 2 - 1 + 0 + 1 + 2 + 3) = (4 + 4 + 2 + 2 + 1 + 0 + 0)$$

and $$a_0 \sum_{i=1}^{M} x_i + a_1 \sum_{i=1}^{M} x_i^2 =$$

$$\sum_{i=1}^{M} x_i y_i = a_1(9 + 4 + 1 + 0 + 1 + 4 + 9) = (-12 - 8 - 2 + 0 + 1 + 0 + 0),$$

respectively, which give $7a_0=13$ and $28a_1=-21$, respectively. In other words, $a_0=13/7$ and $a_1=-3/4$, so that, the first degree polynomial (the straight line) that provides the best fit, in the least-squares sense, is $P_1(x)=13/7-3/4x$, as shown in FIG. 17.

In various other alternative illustrative embodiments, samples may be collected for M data points $(x_i, y_i)$, where $i=1, 2, \ldots, M$, and a polynomial of degree N, $$P_N(x) = a_0 + a_1 x + a_2 x^2 + \cdots + a_k x^k + \cdots + a_N x^N = \sum_{k=0}^{N} a_k x^k,$$

may be fit (in a least-squares sense) to the M data points $(x_i, y_i)$. For example, 100 time data points (M=100) may be taken relating the degree of sputter target consumption, as measured by sputter target life p, the deposition plasma power $f$, and/or the deposition time T, during one or more metal deposition processing steps, to the deposition rate t of metal layers being formed during the respective one or more metal deposition processing steps, resulting in the M data points $(p_i, t_i)$, $(f_i, t_i)$, and/or $(T_i, t_i)$. The values may be the actually measured values of the metal deposition processing tool variables and/or metal deposition processing parameters, or ratios of actually measured values (normalized to respective reference setpoints), or logarithms of such ratios, for example. In one illustrative embodiment, the degree N of the polynomial is at least 10 times smaller than M. In various illustrative embodiments, the degree N of the polynomial may be about 2 and the minimum number of data points M may be about 25.

The function $F(a_0, a_1, \ldots, a_N)$ may be minimized as follows. The function $F(a_0, a_1, \ldots, a_N)$ is given by $$F(a_0, a_1, \cdots, a_N) = \sum_{i=1}^{M} \varepsilon_i^2 = \sum_{i=1}^{M} [P_N(x_i) - y_i]^2$$

and setting the partial derivatives of $F(a_0, a_1, \ldots, a_N)$ with respect to $a_j$, for $j=0, 1, \ldots, N$, equal to zero gives $$\frac{\partial F(a_0, a_1, \cdots, a_N)}{\partial a_j} = 2 \sum_{i=1}^{M} [P_N(x_i) - y_i] x_i^j = 2 \sum_{i=1}^{M} \left[ \sum_{k=0}^{N} a_k x_i^k - y_i \right] x_i^j = 0,$$

for $j=0, 1, \ldots, N$, since $(x_i)^j$ is the coefficient of $a_j$ in the polynomial $$P_N(x_i) = \sum_{k=0}^{N} a_k x_i^k.$$

Simplifying and rearranging gives $$\sum_{i=1}^{M} \left[ \sum_{k=0}^{N} a_k x_i^k \right] x_i^j = \sum_{k=0}^{N} a_k \left[ \sum_{i=1}^{M} x_i^{k+j} \right] \equiv \sum_{k=0}^{N} a_k S_{k+j} = \sum_{i=1}^{M} x_i^j y_i \equiv T_j,$$

for $j=0, 1, \ldots, N$, where $$\sum_{i=1}^{M} x_i^{k+j} \equiv S_{k+j} \text{ and } \sum_{i=1}^{M} x_i^j y_i \equiv T_j,$$

respectively. There are N+1 equations $$\sum_{k=0}^{N} a_k S_{k+j} = T_j,$$

for $j=0, 1, \ldots, N$, also known as the normal equations, for the N+1 unknown parameters $a_k$, for $k=0, 1, \ldots, N$, readily yielding a solution, provided that the determinant of the normal equations is not zero. This may be demonstrated by showing that the homogeneous equations $$\sum_{k=0}^{N} a_k S_{k+j} = 0$$

only have the trivial solution $a_k=0$, for $k=0, 1, \ldots, N$, which may be shown as follows. Multiply the jth homogeneous equation by $a_j$ and sum over all j, from $j=0$ to $j=N$, $$\sum_{j=0}^{N} a_j \sum_{k=0}^{N} a_k S_{k+j} = \sum_{j=0}^{N} a_j \sum_{k=0}^{N} a_k \sum_{i=1}^{M} x_i^k x_i^j =$$

$$\sum_{i=1}^{M} \left( \sum_{k=0}^{N} a_k x_i^k \right) \left( \sum_{j=0}^{N} a_j x_i^j \right) = \sum_{i=1}^{M} (P_N(x_i))^2 = 0,$$

which would imply that $P_N(x_i)=0$, and, hence, that $a_k=0$, for $k=0, 1, \ldots, N$, the trivial solution. Therefore, the determinant of the normal equations is not zero, and the normal equations may be solved for the N+1 parameters $a_k$, for $k=0, 1, \ldots N$, the coefficients of the least-squares polynomial of degree N, $$P_N(x) = \sum_{k=0}^{N} a_k x^k,$$

that may be fit to the M data points $(x_i, y_i)$.

Finding the least-squares polynomial of degree N, $$P_N(x) = \sum_{k=0}^{N} a_k x^k,$$

that may be fit to the M data points $(x_i,y_i)$ may not be easy when the degree N of the least-squares polynomial is very large. The N+1 normal equations $$\sum_{k=0}^{N} a_k S_{k+j} = T_j,$$

for j=0, 1, ..., N, for the N+1 unknown parameters $a_k$, for k=0, 1, ..., N, may not be easy to solve, for example, when the degree N of the least-squares polynomial is much greater than about 10. This may be demonstrated as follows. Suppose that the M data points $(x_i,y_i)$ are more or less uniformly distributed in the interval $0 \leq x \leq 1$, so that $$S_{k+j} = \sum_{i=0}^{M} x_i^{k+j} \approx M \int_0^1 x^{k+j} dx = \frac{M}{k+j+1}.$$

The resulting determinant for the normal equations is then approximately given by $$|S_{k+j}| \approx \left|\frac{M}{k+j+1}\right| \approx M^{N+1}\left|\frac{1}{k+j+1}\right| = M^{N+1} H_{N+1},$$

for j,k=0, 1, ..., N, where $H_N$, for j,k=0, 1, ..., N−1, is the Hilbert determinant of order N, which has the value $$H_N = \frac{[0!1!2!3! \cdots (N-1)!]^3}{N!(N+1)!(N+2)! \cdots (2N-1)!}$$

that approaches zero very rapidly. For example, $$H_1 = \frac{[0!]^3}{1!} = |1| = 1, H_2 = \frac{[0!1!]^3}{2!3!} = \begin{vmatrix} 1 & \frac{1}{2} \\ \frac{1}{2} & \frac{1}{3} \end{vmatrix} = \frac{1}{3} - \frac{1}{4} = \frac{1}{12},$$

$$\text{and } H_3 = \frac{[0!1!2!]^3}{3!4!5!} = \begin{vmatrix} 1 & \frac{1}{2} & \frac{1}{3} \\ \frac{1}{2} & \frac{1}{3} & \frac{1}{4} \\ \frac{1}{3} & \frac{1}{4} & \frac{1}{5} \end{vmatrix},$$

where $$\begin{vmatrix} 1 & \frac{1}{2} & \frac{1}{3} \\ \frac{1}{2} & \frac{1}{3} & \frac{1}{4} \\ \frac{1}{3} & \frac{1}{4} & \frac{1}{5} \end{vmatrix} = \frac{1}{3}\begin{vmatrix} \frac{1}{2} & \frac{1}{3} \\ \frac{1}{3} & \frac{1}{4} \end{vmatrix} - \frac{1}{4}\begin{vmatrix} 1 & \frac{1}{2} \\ \frac{1}{3} & \frac{1}{4} \end{vmatrix} + \frac{1}{5}\begin{vmatrix} 1 & \frac{1}{2} \\ \frac{1}{2} & \frac{1}{3} \end{vmatrix} =$$

$$\frac{1}{3}\frac{1}{72} - \frac{1}{4}\frac{1}{12} + \frac{1}{5}\frac{1}{12} = \frac{1}{216} - \frac{1}{240} = \frac{1}{2160}.$$

This suggests that the system of normal equations is ill-conditioned and, hence, difficult to solve when the degree N of the least-squares polynomial is very large. Sets of orthogonal polynomials tend to be better behaved.

Figure 18:
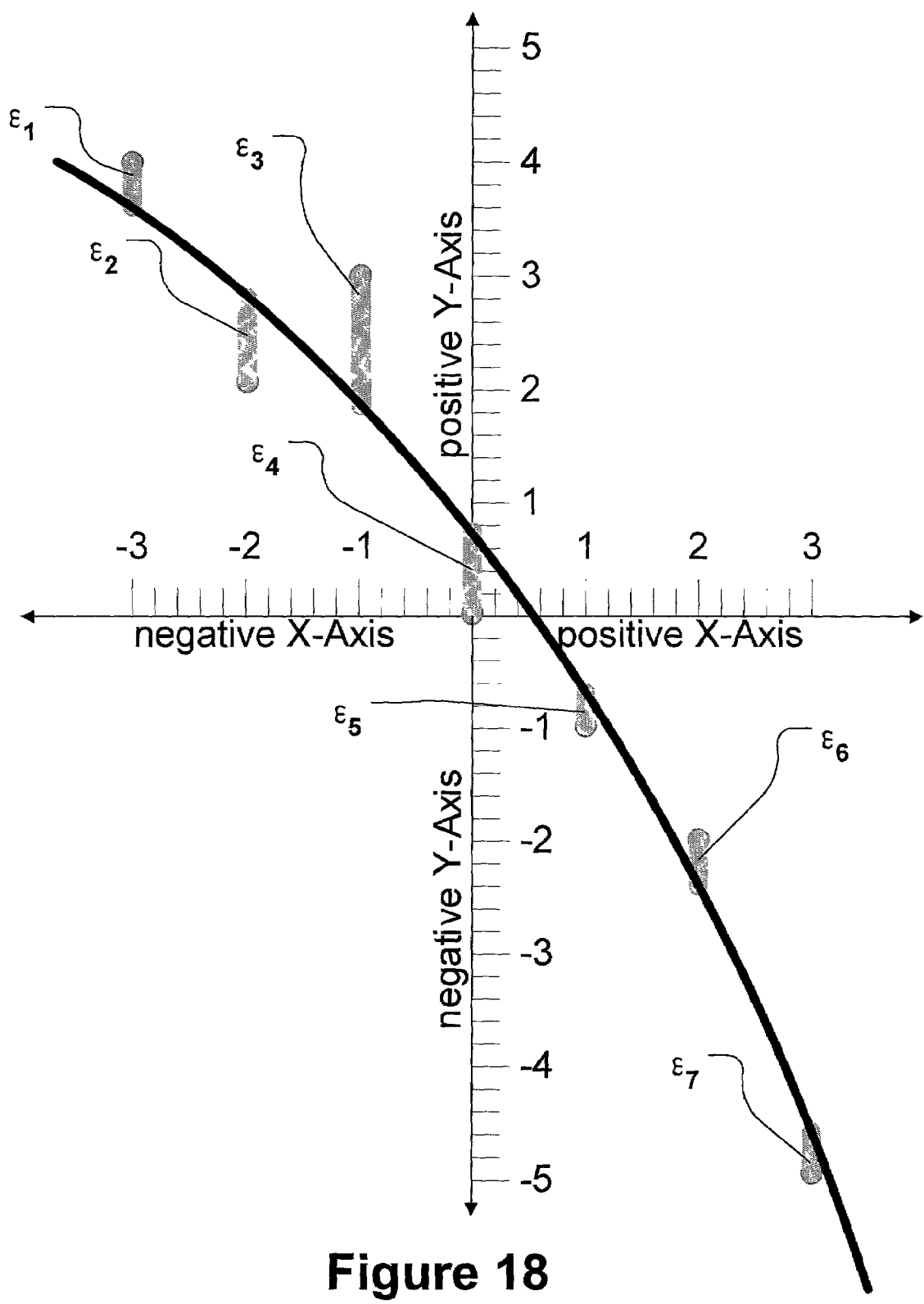

As shown in FIG. 18, for example, a second degree polynomial (a quadratic), $$P_2(x) = a_0 + a_1 x + a_2 x^2 = \sum_{k=0}^{2} a_k x^k,$$

may be fit (in a least-squares sense) to the M=7 data points (−3,4), (−2,2), (−1,3), (0,0), (1,−1), (2,−2), and (3,−5). The residuals $\epsilon_i$, for i=1, 2, ..., 7, are schematically illustrated in FIG. 18. The three normal equations are $$\sum_{k=0}^{2} a_k S_{k+j} = T_j,$$

for j=0, 1, 2, where $$\sum_{i=1}^{7} x_i^{k+j} \equiv S_{k+j} \text{ and } \sum_{i=1}^{7} x_i^j y_i T_j,$$

respectively, for the three parameters $a_0$, and $a_1$ and $a_2$. This gives $$\sum_{k=0}^{2} a_k S_k = T_0, \sum_{k=0}^{2} a_k S_{k+1} = T_1, \text{ and } \sum_{k=0}^{2} a_k S_{k+2} = T_2,$$

where $$S_0 = \sum_{i=1}^{7} x_i^0 = 7; S_1 = \sum_{i=1}^{7} x_i = (-3-2-1+1+2+3) = 0;$$

$$S_2 = \sum_{i=1}^{7} x_i^2 = (9+4+1+1+4+9) = 28;$$

$$S_3 = \sum_{i=1}^{7} x_i^3 = (-27-8-1+0+1+8+27) = 0;$$

$$S_4 = \sum_{i=1}^{7} x_i^4 = (81+16+1+0+1+16+81) = 196;$$

$$T_0 = \sum_{i=1}^{7} y_i = (4+2+3+0-1-2-5) = 1;$$

$$T_1 = \sum_{i=1}^{7} x_i y_i = (-12-4-3+0-1-4-15) = -39;$$

and $$T_2 = \sum_{i=1}^{7} x_i^2 y_i = (36 + 8 + 3 + 0 - 1 - 8 - 45) = -7,$$

so that the normal equations become $$\sum_{k=0}^{2} a_k S_k = T_0 = 1 = 7a_0 + 0a_1 + 28a_2 = 7a_0 + 28a_2,$$

$$\sum_{k=0}^{2} a_k S_{k+1} = T_1 = -39 = 0a_0 + 28a_1 + 0a_2,$$

and $$\sum_{k=0}^{2} a_k S_{k+2} = T_2 = -7 = 28a_0 + 0a_1 + 196a_2 = 28a_0 + 196a_2,$$

and respectively, which imply (upon multiplying the first normal equation by 7 and then subtracting that from the third normal equation) that $-14 = -21a_0$, that $28a_1 = -39$ (from the second normal equation), and (upon multiplying the first normal equation by 4 and then subtracting that from the third normal equation) that $-11 = 84a_2$, giving $3a_0 = 2$, $28a_1 = -39$, and $84a_2 = -11$, respectively. In other words, $a_0 = 2/3$, $a_1 = -39/28$, and $a_2 = 11/84$, so that, the second degree polynomial (the quadratic) that provides the best fit, in the least-squares sense, is $P_2(x) = 2/3 - 39/28x - 11/84x^2 = 1/84(56 - 117x - 11x^2)$, as shown in FIG. 18.

Figure 19:
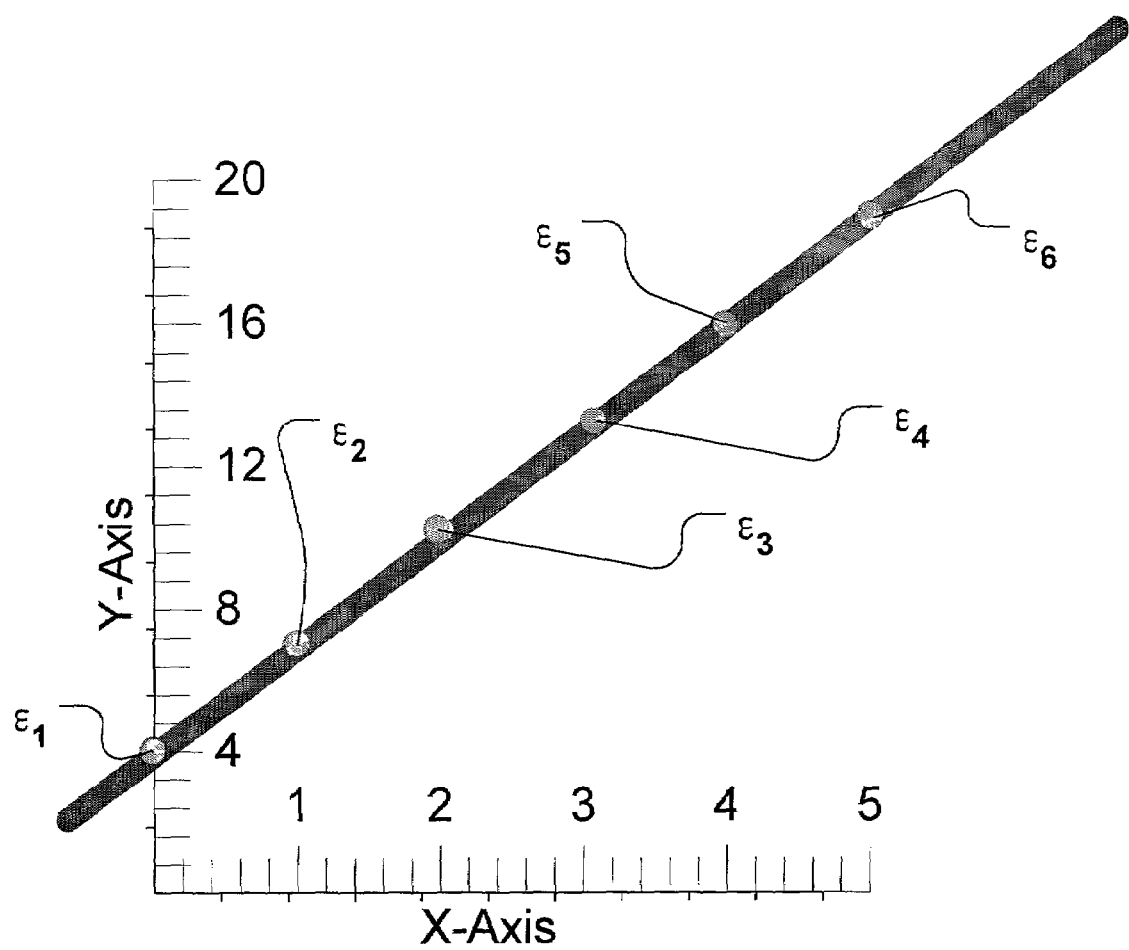

As shown in FIG. 19, for example, a second degree polynomial (a quadratic), $$P_2(x) = a_0 + a_1 x + a_2 x^2 = \sum_{k=0}^{2} a_k x^k,$$

may be fit (in a least-squares sense) to the M=6 data points (0,4), (1,7), (2,10), (3,13), (4,16), and (5,19). The residuals $\epsilon_i$, for i=1, 2, ..., 6, are schematically illustrated in FIG. 19. The three normal equations are $$\sum_{k=0}^{2} a_k S_{k+j} = T_j,$$

for j=0, 1, 2, where $$\sum_{i=1}^{6} x_i^{k+j} \equiv S_{k+1} \text{ and } \sum_{i=1}^{6} x_i^j y_i \equiv T_j,$$

respectively, for the three parameters $a_0$, and $a_1$ and $a_2$. This gives $$\sum_{k=0}^{2} a_k S_k = T_0, \sum_{k=0}^{2} a_k S_{k+1} = T_1, \text{ and } \sum_{k=0}^{2} a_k S_{k+2} = T_2,$$

where $$S_0 = \sum_{i=1}^{6} x_i^0 = 6; S_1 = \sum_{i=1}^{6} x_i = (0 + 1 + 2 + 3 + 4 + 5) = 15;$$

$$S_2 = \sum_{i=1}^{6} x_i^2 = (1 + 4 + 9 + 16 + 25) = 55;$$

$$S_3 = \sum_{i=1}^{6} x_i^3 = (0 + 1 + 8 + 27 + 64 + 125) = 225;$$

$$S_4 = \sum_{i=1}^{6} x_i^4 = (0 + 1 + 16 + 81 + 256 + 625) = 979;$$

$$T_0 = \sum_{i=1}^{6} y_i = (4 + 7 + 10 + 13 + 16 + 19) = 69;$$

$$T_1 = \sum_{i=1}^{6} x_i y_i = (0 + 7 + 20 + 39 + 64 + 95) = 225;$$

and $$T_2 = \sum_{i=1}^{6} x_i^2 y_i = (0 + 7 + 40 + 117 + 256 + 475) = 895,$$

so that the normal equations become $$\sum_{k=0}^{2} a_k S_k = T_0 = 69 = 6a_0 + 15a_1 + 55a_2,$$

$$\sum_{k=0}^{2} a_k S_{k+1} = T_1 = 225 = 15a_0 + 55a_1 + 225a_2,$$

and $$\sum_{k=0}^{2} a_k S_{k+2} = T_2 = 895 = 55a_0 + 225a_1 + 979a_2,$$

respectively, which imply (upon multiplying the second normal equation by 4 and then subtracting that from the first normal equation multiplied by 10) that $-210 = -70a_1 - 350a_2$, and (upon multiplying the second normal equation by 11 and then subtracting that from the third normal equation multiplied by 3) that $210 = 70a_1 + 66a_2$. However, adding these last two results together shows that $0 = a_2$. Furthermore, $3 = a_1$.

Therefore, using the fact that $3=a_1$ and $0=a_2$, the normal equations become $$\sum_{k=0}^{2} a_k S_k = T_0 = 69 = 6a_0 + 45, \sum_{k=0}^{2} a_k S_{k+1} = T_1 = 225 = 15a_0 + 165,$$

and $$\sum_{k=0}^{2} a_k S_{k+2} = T_2 = 895 = 55a_0 + 675,$$

respectively, which all imply that $4=a_0$. In other words, $a_0=4$, $a_1=3$, and $a_2=0$, so that, the second degree polynomial (the quadratic) that provides the best fit, in the least-squares sense, is $P_2(x)=4+3x+0x^2=4+3x$, which is really just a straight line, as shown in FIG. 19. The residuals $\epsilon_i$, for $i=1, 2, \ldots, 6$, all vanish identically in this case, as schematically illustrated in FIG. 19.

In various other alternative illustrative embodiments, samples may be collected for M data points $(x_i,y_i)$, where $i=1, 2, \ldots, M$, and a linearly independent set of N+1 functions $f_j(x)$, for $$j = 0, 1, 2, \ldots, N,$$

$$y(x) = a_0 f_0(x) + a_1 f_1(x) + \ldots + a_j f_j(x) + \ldots + a_N f_N(x) = \sum_{j=0}^{N} a_j f_j(x),$$

may be fit (in a non-polynomial least-squares sense) to the M data points $(x_i,y_i)$. For example, 100 time data points (M=100) may be taken relating the degree of sputter target consumption, as measured by sputter target life p, the deposition plasma power $f$ and/or the deposition time T, during one or more metal deposition processing steps, to the deposition rate t of metal layers being formed during the respective one or more metal deposition processing steps, resulting in the M data points $(p_i,t_i)$, $(f_i,t_i)$, and/or $(T_i,t_i)$. The values may be the actually measured values of the metal deposition processing tool variables and/or metal deposition processing parameters, or ratios of actually measured values (normalized to respective reference setpoints), or logarithms of such ratios, for example. In one illustrative embodiment, the number N+1 of the linearly independent set of basis functions $f_j(x)$ is at least 10 times smaller than M. In various illustrative embodiments, the degree N of the polynomial may be about 2 and the minimum number of data points M may be about 25.

The function $F(a_0, a_1, \ldots, a_N)$ may be minimized as follows. The function $F(a_0, a_1, \ldots, a_N)$ is given by $$F(a_0, a_1 \ldots, a_N) = \sum_{i=1}^{M} \varepsilon_i^2 = \sum_{i=1}^{M} [y(x_i) - y_i]^2$$

and setting the partial derivatives of $F(a_0, a_1, \ldots, a_N)$ with respect to $a_j$, for $j=0, 1, \ldots, N$, equal to zero gives $$\frac{\partial F(a_0, a_1, \ldots, a_N)}{\partial a_j} =$$

$$2\sum_{i=1}^{M} [y(x_i) - y_i] x_i^j = 2 \sum_{i=1}^{M} \left[\sum_{k=0}^{N} a_k f_k(x_i) - y_i\right] f_j(x_i) = 0,$$

for $j=0, 1, \ldots, N$, since $f_j(x_i)$ is the coefficient of $a_j$ in the representation $$y(x_i) = \sum_{k=0}^{N} a_k f_k(x_i).$$

Simplifying gives $$\sum_{i=1}^{M} \left[\sum_{k=0}^{N} a_k f_k(x_i)\right] f_j(x_i) =$$

$$\sum_{k=0}^{N} a_k \left[\sum_{i=1}^{M} f_k(x_i) f_j(x_i)\right] \equiv \sum_{k=0}^{N} a_k S_{k,j} = \sum_{i=1}^{M} f_j(x_i) y_i \equiv T_j,$$

for $j=0, 1, \ldots, N$, where $$\sum_{i=1}^{M} f_k(x_i) f_j(x_i) \equiv S_{k,j} \text{ and } \sum_{i=1}^{M} f_j(x_i) y_i \equiv T_j,$$

respectively. There are N+1 equations $$\sum_{k=0}^{N} a_k S_{k,j} = T_j,$$

for $j=0, 1, \ldots, N$, also known as the normal equations, for the N+1 unknown parameters $a_k$, for $k=0, 1, \ldots, N$, readily yielding a solution, provided that the determinant of the normal equations is not zero. This may be demonstrated by showing that the homogeneous equations $$\sum_{k=0}^{N} a_k S_{k,j} = 0$$

only have the trivial solution $a_k=0$, for $k=0, 1, \ldots, N$, which may be shown as follows. Multiply the jth homogeneous equation by $a_j$ and sum over all j, $$\sum_{j=0}^{N} a_j \sum_{k=0}^{N} a_k S_{k,j} =$$

$$\sum_{j=0}^{N} a_j \sum_{k=0}^{N} a_k \sum_{i=1}^{M} f_k(x_i) f_j(x_i) = \sum_{i=1}^{M} \left(\sum_{k=0}^{N} a_k f_k(x_i)\right) \left(\sum_{j=0}^{N} a_j f_j(x_i)\right),$$

but $$\sum_{i=1}^{M}\left(\sum_{k=0}^{N}a_kf_k(x_i)\right)\left(\sum_{j=0}^{N}a_jf_j(x_i)\right)=\sum_{i=1}^{M}(y(x_i))^2=0,$$

which would imply that $y(x_i) \equiv 0$, and, hence, that $a_k = 0$, for $k = 0, 1, \ldots, N$, the trivial solution. Therefore, the determinant of the normal equations is not zero, and the normal equations may be solved for the N+1 parameters $a_k$, for $k = 0, 1, \ldots, N$, the coefficients of the non-polynomial least-squares representation $$y(x)=\sum_{j=0}^{N}a_jf_j(x)$$

that may be fit to the M data points $(x_i, y_i)$, using the linearly independent set of N+1 functions $f_j(x)$ as the basis for the non-polynomial least-squares representation $$y(x)=\sum_{j=0}^{N}a_jf_j(x).$$

If the data points $(x_i, y_i)$ are not equally reliable for all M, it may be desirable to weight the data by using non-negative weighting factors $w_i$. The function $F(a_0, a_1, \ldots, a_N)$ may be minimized as follows. The function $F(a_0, a_1, \ldots, a_N)$ is given by $$F(a_0,a_1,\ldots,a_N)=\sum_{i=1}^{M}w_i\varepsilon_i^2=\sum_{i=1}^{M}w_i[y(x_i)-y_i]^2$$

and setting the partial derivatives of $F(a_0, a_1, \ldots, a_N)$ with respect to $a_j$, for $j = 0, 1, \ldots, N$, equal to zero gives $$\frac{\partial F(a_0,a_1,\ldots,a_N)}{\partial a_J}2\sum_{i=1}^{M}w_i[y(x_i)-y_i]x_i^j=$$

$$2\sum_{i=1}^{M}w_i\left[\sum_{k=1}^{N}a_kf_k(x_i)-y_i\right]f_j(x_i)=0,$$

for $j = 0, 1, \ldots, N$, since $f_j(x_i)$ is the coefficient of $a_j$ in the representation $$y(x_i)=\sum_{k=0}^{N}a_kf_k(x_i).$$

Simplifying gives $$\sum_{i=1}^{M}w_i\left[\sum_{k=0}^{N}a_kf_k(x_i)\right]f_J(x_i)=\sum_{k=0}^{N}a_k\left[\sum_{i=1}^{M}w_if_k(x_i)f_J(x_i)\right]=\sum_{i=1}^{M}w_if_J(x_i)y_i,$$

or $$\sum_{k=0}^{N}a_k\left[\sum_{i=1}^{M}w_if_k(x_i)f_J(x_i)\right]\equiv\sum_{k=0}^{N}a_kS_{k,J}=\sum_{i=1}^{M}w_if_J(x_i)y_i\equiv T_J$$

for $j = 0, 1, \ldots, N$, where $$\sum_{i=1}^{M}w_if_k(x_i)f_J(x_i)\equiv S_{k,J} \text{ and } \sum_{i=1}^{M}w_if_j(x_i)y_i\equiv T_J,$$

respectively. There are N+1 equations $$\sum_{k=0}^{N}a_kS_{k,j}=T_j,$$

for $j = 0, 1, \ldots, N$, also known as the normal equations, including the non-negative weighting factors $w_i$, for the N+1 unknown parameters $a_k$, for $k = 0, 1, \ldots, N$, readily yielding a solution, provided that the determinant of the normal equations is not zero. This may be demonstrated by showing that the homogeneous equations $$\sum_{k=0}^{N}a_kS_{k,j}=0$$

only have the trivial solution $a_k = 0$, for $k = 0, 1, \ldots, N$, which may be shown as follows. Multiply the jth homogeneous equation by $a_j$ and sum over all j, $$\sum_{j=0}^{N}a_j\sum_{k=0}^{N}a_kS_{k,j}=$$

$$\sum_{j=0}^{N}a_j\sum_{k=0}^{N}a_k\sum_{i=1}^{M}w_if_k(x_i)f_j(x_i)=\sum_{i=1}^{M}w_i\left(\sum_{k=0}^{N}a_kf_k(x_i)\right)\left(\sum_{j=0}^{N}a_jf_j(x_i)\right),$$

but $$\sum_{i=1}^{M}w_i\left(\sum_{k=0}^{N}a_kf_k(x_i)\right)\left(\sum_{j=0}^{N}a_jf_j(x_i)\right)=\sum_{i=1}^{M}w_i(y(x_i))^2=0,$$

which would imply that $y(x_i) \equiv 0$, and, hence, that $a_k = 0$, for $k = 0, 1, \ldots, N$, the trivial solution. Therefore, the determinant of the normal equations is not zero, and the normal equations, including the non-negative weighting factors $w_i$, may be solved for the N+1 parameters $a_k$, for k=0, 1, ..., N, the coefficients of the non-polynomial least-squares representation $$y(x) = \sum_{j=0}^{N} a_j f_j(x)$$

that may be fit to the M data points $(x_i, y_i)$, using the linearly independent set of N+1 functions $f_j(x)$ as the basis for the non-polynomial least-squares representation $$y(x) = \sum_{j=0}^{N} a_j f_j(x),$$

and including the non-negative weighting factors $w_i$.

Any of the above-disclosed embodiments of a method according to the present invention enables the use of parametric measurements sent from measuring tools to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. A method comprising:
   monitoring consumption of a sputter target to determine a deposition rate of a metal layer during metal deposition processing using the sputter target;
   modeling a dependence of the deposition rate on at least one of deposition plasma power and deposition time, modeling said dependence of the deposition rate comprising using sensor data relating to metal deposition processing for performing said modeling;
   modeling a dependence of the deposition rate on a target life of the sputter target; and
   applying the deposition rate model to modify the metal deposition processing to form the metal layer to approach a desired thickness.

2. The method of claim 1, wherein modeling the dependence of the deposition rate on the at least one of the deposition plasma power and the deposition time comprises modeling the dependence of the deposition rate on both the deposition plasma power and the deposition time.

3. The method of claim 1, wherein applying the deposition rate model to modify the metal deposition processing comprises inverting the deposition rate model to determine the at least one of the deposition plasma power and the deposition time to form the metal layer to have the desired thickness.

4. The method of claim 2, wherein applying the deposition rate model to modify the metal deposition processing comprises inverting the deposition rate model to determine the deposition plasma power and the deposition time to form the metal layer to have the desired thickness.

5. The method of claim 1, wherein modeling the dependence of the deposition rate on the at least one of the deposition plasma power and the deposition time comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

6. The method of claim 1, wherein modeling the dependence of the deposition rate on the target life of the sputter target comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

7. The method of claim 1, wherein modeling the dependence of the deposition rate comprises modeling the changes in the deposition rate.

8. The method of claim 7, wherein modeling the changes in the deposition rate comprises modeling the changes over a predetermined life of the sputter target.

9. The method of claim 8, further comprising:
   in response to the modeled changes over the predetermined life of the sputter target, automatically modifying a process recipe of the metal deposition processing.

10. The method of claim 9, further comprising:
    inverting the deposition rate model to determine the at least one of the deposition plasma power and the deposition time to maintain the process recipe such that the desired thickness of the metal layer remains within a target thickness on a run-to-run basis.

11. A computer readable, program storage device, encoded with instructions that, when executed by a computer, perform a method comprising:
    monitoring consumption of a sputter target to determine a deposition rate of a metal layer during metal deposition processing using the sputter target;
    modeling a dependence of the deposition rate on at least one of deposition plasma power and deposition time, modeling said dependence of the deposition rate comprising using sensor data relating to metal deposition processing for performing said modeling;
    modeling a dependence of the deposition rate on a target life of the sputter target; and
    applying the deposition rate model to modify the metal deposition processing to form the metal layer to have a desired thickness.

12. The device of claim 11, wherein modeling the dependence of the deposition rate on the at least one of the deposition plasma power and the deposition time comprises modeling the dependence of the deposition rate on both the deposition plasma power and the deposition time.

13. The device of claim 11, wherein applying the deposition rate model to modify the metal deposition processing comprises inverting the deposition rate model to determine the at least one of the deposition plasma power and the deposition time to form the metal layer to have the desired thickness.

14. The device of claim 12, wherein applying the deposition rate model to modify the metal deposition processing comprises inverting the deposition rate model to determine the deposition plasma power and the deposition time to form the metal layer to have the desired thickness.

15. The device of claim 11, wherein modeling the dependence of the deposition rate on the at least one of the deposition plasma power and the deposition time comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

16. The device of claim 11, wherein modeling the dependence of the deposition rate on the target life of the sputter target comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

17. A computer programmed to perform a method comprising:
monitoring consumption of a sputter target to determine a deposition rate of a metal layer during metal deposition processing using the sputter target;
modeling a dependence of the deposition rate on at least one of deposition plasma power and deposition time, modeling said dependence of the deposition rate comprising using sensor data relating to metal deposition processing for performing said modeling;
modeling a dependence of the deposition rate on a target life of the sputter target; and
applying the deposition rate model to modify the metal deposition processing to form the metal layer to have a desired thickness.

18. The computer of claim 17, wherein modeling the dependence of the deposition rate on the at least one of the deposition plasma power and the deposition time comprises modeling the dependence of the deposition rate on both the deposition plasma power and the deposition time.

19. The computer of claim 17, wherein applying the deposition rate model to modify the metal deposition processing comprises inverting the deposition rate model to determine the at least one of the deposition plasma power and the deposition time to form the metal layer to have the desired thickness.

20. The computer of claim 18, wherein applying the deposition rate model to modify the metal deposition processing comprises inverting the deposition rate model to determine the deposition plasma power and the deposition time to form the metal layer to have the desired thickness.

21. The computer of claim 17, wherein modeling the dependence of the deposition rate on the at least one of the deposition plasma power and the deposition time comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

22. The computer of claim 17, wherein modeling the dependence of the deposition rate on the target life of the sputter target comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

23. A method comprising:
monitoring consumption of a sputter target to determine a deposition rate of a metal layer during metal deposition processing using the sputter target by modeling a dependence of the deposition rate on a target life of the sputter target;
modeling a dependence of the deposition rate on at least one of deposition plasma power and deposition time, modeling said dependence of the deposition rate comprising using sensor data relating to metal deposition processing for performing said modeling; and
applying the deposition rate model to modify the metal deposition processing to form the metal layer to have a desired thickness.

24. The method of claim 23, wherein modeling the dependence of the deposition rate on the target life of the sputter target comprises modeling the dependence of the deposition rate on target lives of a plurality of previously processed sputter targets.

25. The method of claim 23, wherein modeling the dependence of the deposition rate on the at least one of the deposition plasma power and the deposition time comprises modeling the dependence of the deposition rate on both the deposition plasma power and the deposition time.

26. The method of claim 24, wherein modeling the dependence of the deposition rate on the at least one of the deposition plasma power and the deposition time comprises modeling the dependence of the deposition rate on both the deposition plasma power and the deposition time.

27. The method of claim 23, wherein applying the deposition rate model to modify the metal deposition processing comprises inverting the deposition rate model to determine the at least one of the deposition plasma power and the deposition time to form the metal layer to have the desired thickness.

28. The method of claim 24, wherein applying the deposition rate model to modify the metal deposition processing comprises inverting the deposition rate model to determine the at least one of the deposition plasma power and the deposition time to form the metal layer to have the desired thickness.

29. The method of claim 25, wherein applying the deposition rate model to modify the metal deposition processing comprises inverting the deposition rate model to determine the deposition plasma power and the deposition time to form the metal layer to have the desired thickness.

30. The method of claim 26, wherein applying the deposition rate model to modify the metal deposition processing comprises inverting the deposition rate model to determine the deposition plasma power and the deposition time to form the metal layer to have the desired thickness.

31. The method of claim 23, wherein modeling the dependence of the deposition rate on the at least one of the deposition plasma power and the deposition time comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

32. The method of claim 24, wherein modeling the dependence of the deposition rate on the target lives of the plurality of previously processed sputter targets comprises fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

33. A system comprising:
a tool monitoring consumption of a sputter target to determine a deposition rate of a metal layer during metal deposition processing using the sputter target;
a computer modeling a dependence of the deposition rate on at least one of deposition plasma power and deposition time, modeling said dependence of the deposition rate comprising using sensor data relating to metal deposition processing for performing said modeling, said computer modeling a dependence of the deposition rate on a target life of the sputter target; and
a controller applying the deposition rate model to modify the metal deposition processing to form the metal layer to have a desired thickness.

34. The system of claim 33, wherein the computer modeling the dependence of the deposition rate on the at least one of the deposition plasma power and the deposition time models the dependence of the deposition rate on both the deposition plasma power and the deposition time.

35. The system of claim 33, wherein the controller applying the deposition rate model to modify the metal deposition processing inverts the deposition rate model to determine the at least one of the deposition plasma power and the deposition time to form the metal layer to have the desired thickness.

36. The system of claim 34, wherein the controller applying the deposition rate model to modify the metal deposition processing inverts the deposition rate model to determine the deposition plasma power and the deposition time to form the metal layer to have the desired thickness.

37. The system of claim 33, wherein the computer modeling the dependence of the deposition rate on the at least one of the deposition plasma power and the deposition time fits previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

38. The system of claim 33, wherein the tool modeling the dependence of the deposition rate on the target life of the sputter target fits previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

39. A device comprising:
means for monitoring consumption of a sputter target to determine a deposition rate of a metal layer during metal deposition processing using the sputter target;
means for modeling a dependence of the deposition rate on at least one of deposition plasma power and deposition time, modeling said dependence of the deposition rate comprising using sensor data relating to metal deposition processing for performing said modeling;
means for modeling a dependence of the deposition rate on a target life of the sputter target; and
means for applying the deposition rate model to modify the metal deposition processing to form the metal layer to have a desired thickness.

40. The device of claim 39, wherein the means for monitoring the consumption of the sputter target to determine the deposition rate of the metal layer during the metal deposition processing comprises means for modeling a dependence of the deposition rate on a target life of the sputter target.

41. The device of claim 39, wherein the means for modeling the dependence of the deposition rate on the at least one of the deposition plasma power and the deposition time comprises means for modeling the dependence of the deposition rate on both the deposition plasma power and the deposition time.

42. The device of claim 40, wherein the means for modeling the dependence of the deposition rate on the at least one of the deposition plasma power and the deposition time comprises means for modeling the dependence of the deposition rate on both the deposition plasma power and the deposition time.

43. The device of claim 39, wherein the means for applying the deposition rate model to modify the metal deposition processing comprises means for inverting the deposition rate model to determine the at least one of the deposition plasma power and the deposition time to form the metal layer to have the desired thickness.

44. The device of claim 40, wherein the means for applying the deposition rate model to modify the metal deposition processing comprises means for inverting the deposition rate model to determine the at least one of the deposition plasma power and the deposition time to form the metal layer to have the desired thickness.

45. The device of claim 41, wherein the means for applying the deposition rate model to modify the metal deposition processing comprises means for inverting the deposition rate model to determine the deposition plasma power and the deposition time to form the metal layer to have the desired thickness.

46. The device of claim 42, wherein the means for applying the deposition rate model to modify the metal deposition processing comprises means for inverting the deposition rate model to determine the deposition plasma power and the deposition time to form the metal layer to have the desired thickness.

47. The device of claim 39, wherein the means for modeling the dependence of the deposition rate on the at least one of the deposition plasma power and the deposition time comprises means for fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

48. The device of claim 40, wherein the means for modeling the dependence of the deposition rate on the target life of the sputter target comprises means for fitting previously collected metal deposition processing data using at least one of polynomial curve fitting, least squares fitting, polynomial least squares fitting, non polynomial least squares fitting, weighted least squares fitting, weighted polynomial least squares fitting, and weighted non polynomial least squares fitting.

49. A method comprising:
monitoring consumption of a sputter target to determine a deposition rate of a metal layer during metal deposition processing using the sputter target;
modeling a dependence of the deposition rate based upon a deposition plasma power and a deposition time, modeling said dependence of the deposition rate comprising using sensor data relating to metal deposition processing for performing said modeling;

modeling said dependence of the deposition rate being on a target life of the sputter target, said modeling comprising monitoring the consumption of sputter target on a run-to-run basis; and inverting the deposition rate model to automatically modify the metal deposition processing on the run-to-run basis to form the metal layer to approach a predetermined thickness.

* * * * *